(12) United States Patent
Redemann et al.

(10) Patent No.: US 6,474,700 B2
(45) Date of Patent: Nov. 5, 2002

(54) GAS PANEL

(75) Inventors: Eric J. Redemann, Laguna Niguel; Kim N. Vu, Yorba Linda, both of CA (US)

(73) Assignee: Unit Instruments, Inc., Yorba Linda, CA (US)

( * ) Notice: Subject to any disclaimer, the term of this patent is extended or adjusted under 35 U.S.C. 154(b) by 102 days.

(21) Appl. No.: 09/732,434

(22) Filed: Dec. 7, 2000

(65) Prior Publication Data

US 2002/0020353 A1 Feb. 21, 2002

Related U.S. Application Data

(62) Division of application No. 09/371,655, filed on Aug. 10, 1999, now Pat. No. 6,189,570, which is a division of application No. 08/739,936, filed on Oct. 30, 1996, now Pat. No. 5,992,463.

(51) Int. Cl.$^7$ ................................................ F16L 17/00
(52) U.S. Cl. ........................................ 285/379; 277/616
(58) Field of Search ................................ 137/884, 269; 285/379, 124.1, 125.1; 277/609, 616, 619, 620, 624

(56) References Cited

U.S. PATENT DOCUMENTS

| 3,025,878 A | 3/1962 | Hupp |
| 3,234,964 A | 2/1966 | Tinsley et al. ............... 137/884 |

(List continued on next page.)

FOREIGN PATENT DOCUMENTS

| EP | 0 754 896 A2 | 1/1997 |
| EP | 0 777 259 A1 | 6/1997 |
| EP | 0 845 623 A1 | 6/1998 |
| EP | 0 751 301 A3 | 7/1998 |
| FR | 2 250 907 | 6/1975 |
| FR | 2307151 | 11/1976 |
| JP | 4-35835 | 2/1992 |
| JP | 7-58721 | 3/1995 |
| JP | 7-78128 | 3/1995 |
| JP | 7074113 | 3/1995 |
| JP | 8-312900 | 11/1996 |
| JP | 9-184577 | 7/1997 |
| WO | WO 95/20823 | 8/1985 |
| WO | WO 90/12239 | 10/1990 |
| WO | WO 94/09344 | 4/1994 |
| WO | WO 95/10001 | 4/1995 |
| WO | WO 96/29529 | 9/1996 |
| WO | WO 96/34705 | 11/1996 |
| WO | WO 98/25058 | 6/1998 |
| WO | WO 98 25058 A | 6/1998 |
| WO | WO 98/25058 A | 6/1998 |
| WO | WO 99/15818 | 4/1999 |

OTHER PUBLICATIONS

International Search Report from International patent application PCT/US99/15272, Filed Jul. 7, 1999.
"What you can get in manifolds", Hydraulics and Pneumatics, vol. 16, No. 11, pp. 88–89, Nov. 1963.
CKD Corporation Brochure, "Integrated Valves and MFC with Metal Seal Rings", 5 pages undated.

*Primary Examiner*—John Fox
(74) *Attorney, Agent, or Firm*—Wolf, Greenfield, and Sacks, P.C.

(57) ABSTRACT

A gas panel for use with a tool for manufacturing a semiconductor includes a one-piece manifold body having an inlet for receiving a process gas. The manifold body has at least one lateral wall extending in the general direction of gas flow. The lateral wall includes at least one active device site having an active device thereon. The active device is in gas communication with a gas carrying path formed within the one-piece manifold. The active device may be a manual valve, a pneumatic valve, a pressure regulator, a pressure transducer, a purifier, a filter or a flow controller. The gas is received from the active device at a continuation of the gas flow path in the manifold body and is conveyed to a manifold outlet for ultimate to the tool.

6 Claims, 22 Drawing Sheets

U.S. PATENT DOCUMENTS

| | | | |
|---|---|---|---|
| 3,384,115 A | 5/1968 | Drazan et al. | |
| 3,476,214 A | 11/1969 | Callahan | |
| 3,486,519 A | 12/1969 | Olson | |
| 3,509,904 A | 5/1970 | Olson | |
| 3,915,194 A | 10/1975 | Friedrich | |
| 3,934,605 A | 1/1976 | Legris | |
| 3,993,091 A | 11/1976 | Loveless | |
| 4,008,736 A | 2/1977 | Wittmann-Liebold et al. | 137/606 |
| 4,080,752 A | 3/1978 | Burge | |
| 4,082,324 A | 4/1978 | Obrecht | 285/124.5 |
| 4,093,329 A | 6/1978 | Asbill, III | |
| 4,168,724 A | 9/1979 | Wittmann et al. | |
| 4,181,141 A | 1/1980 | Stoll et al. | |
| 4,247,133 A | 1/1981 | Moller | |
| 4,304,120 A | 12/1981 | Myers et al. | 73/19 |
| 4,352,532 A | 10/1982 | Hardin | |
| 4,524,807 A | 6/1985 | Toliusis | |
| 4,815,280 A | 3/1989 | Tujimura et al. | 73/204 |
| 4,815,496 A | 3/1989 | Nishitani et al. | 137/884 |
| 4,921,072 A | 5/1990 | Divisi | |
| 4,984,460 A | 1/1991 | Isoda | 73/204.15 |
| 5,141,021 A | 8/1992 | Shimomura et al. | 137/486 |
| 5,178,191 A | 1/1993 | Schaefer | |
| 5,255,553 A | 10/1993 | Hale et al. | 73/19.1 |
| 5,292,224 A | 3/1994 | Torli et al. | |
| 5,303,584 A | 4/1994 | Ogasawara et al. | 73/204.21 |
| 5,368,062 A | 11/1994 | Okmura et al. | |
| 5,410,912 A | 5/1995 | Suzuki | 73/204.15 |
| 5,460,204 A | 10/1995 | Rossi | |
| 5,605,179 A | 2/1997 | Strong, Jr. et al. | 137/884 |
| 5,653,259 A | 8/1997 | Ramstad | |
| 5,662,143 A | 9/1997 | Caughran | |
| 5,711,342 A | 1/1998 | Kazama et al. | 137/486 |
| 5,730,181 A | 3/1998 | Doyle et al. | 137/487.5 |
| 5,749,562 A | 5/1998 | Moller et al. | |
| 5,769,110 A | 6/1998 | Ohmi et al. | |
| 5,803,507 A | 9/1998 | Vu | |
| 5,819,782 A | 10/1998 | Itafuji | 137/240 |
| 5,860,676 A | 1/1999 | Brzezicki et al. | |
| 5,979,910 A * | 11/1999 | Shinohara et al. | 277/616 |
| 5,984,318 A * | 11/1999 | Kojima et al. | 277/616 |
| 5,992,463 A | 11/1999 | Redemann et al. | |
| 6,241,254 B1 * | 6/2001 | Gromyko et al. | 277/614 |
| 6,257,592 B1 * | 7/2001 | Hashizawa et al. | 277/596 |
| 6,260,854 B1 * | 7/2001 | Lemon | 277/609 |

* cited by examiner

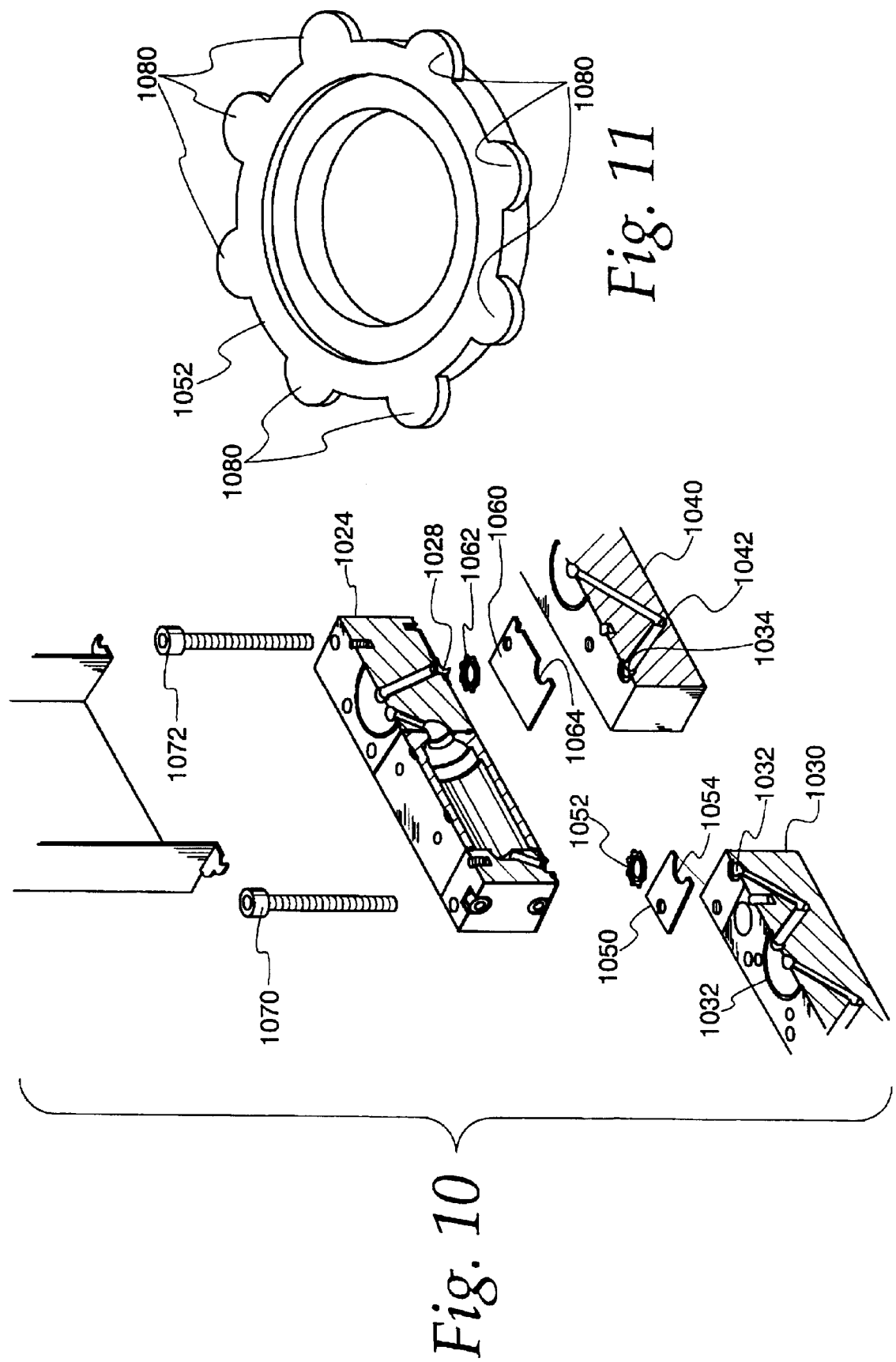

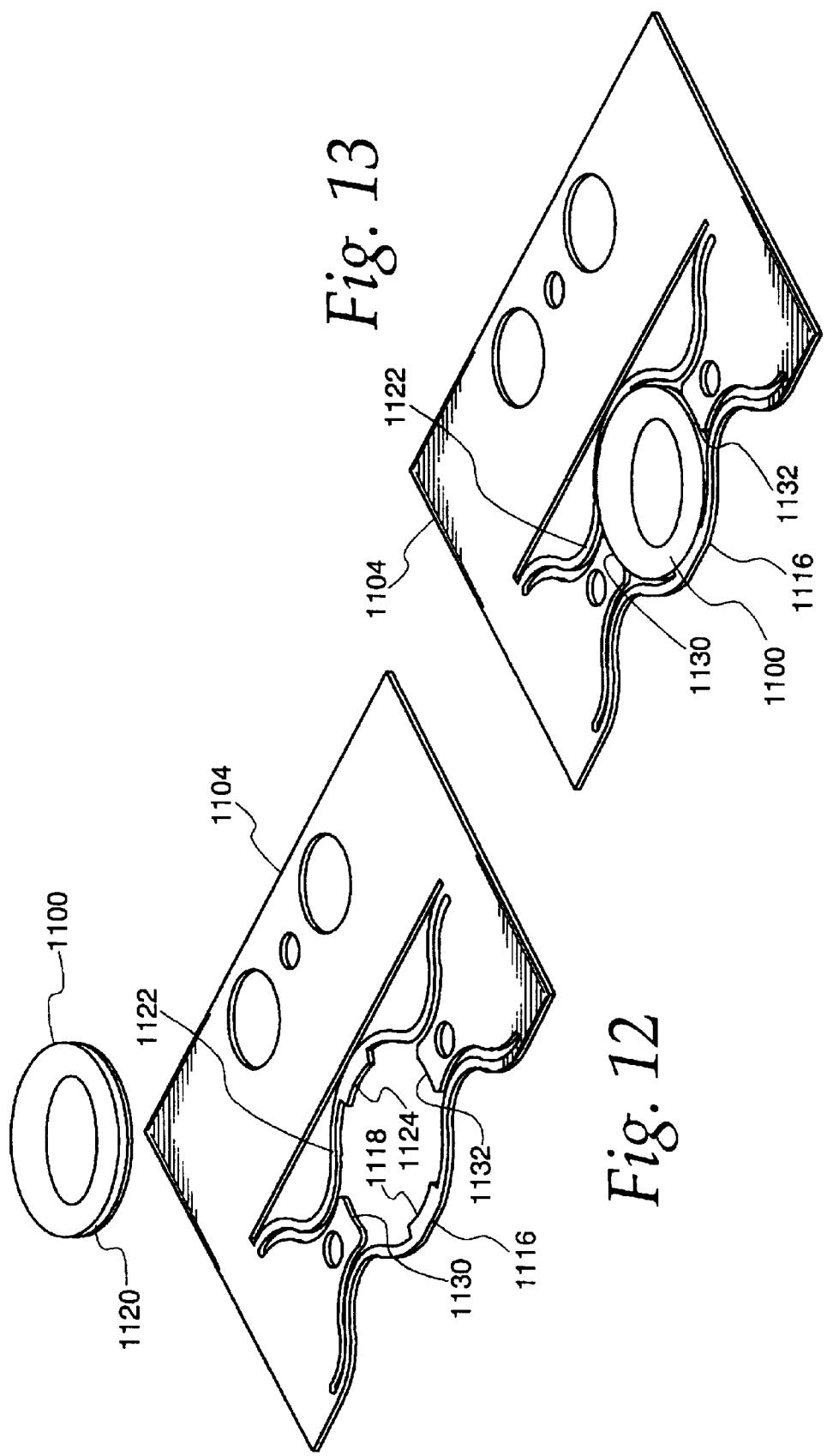

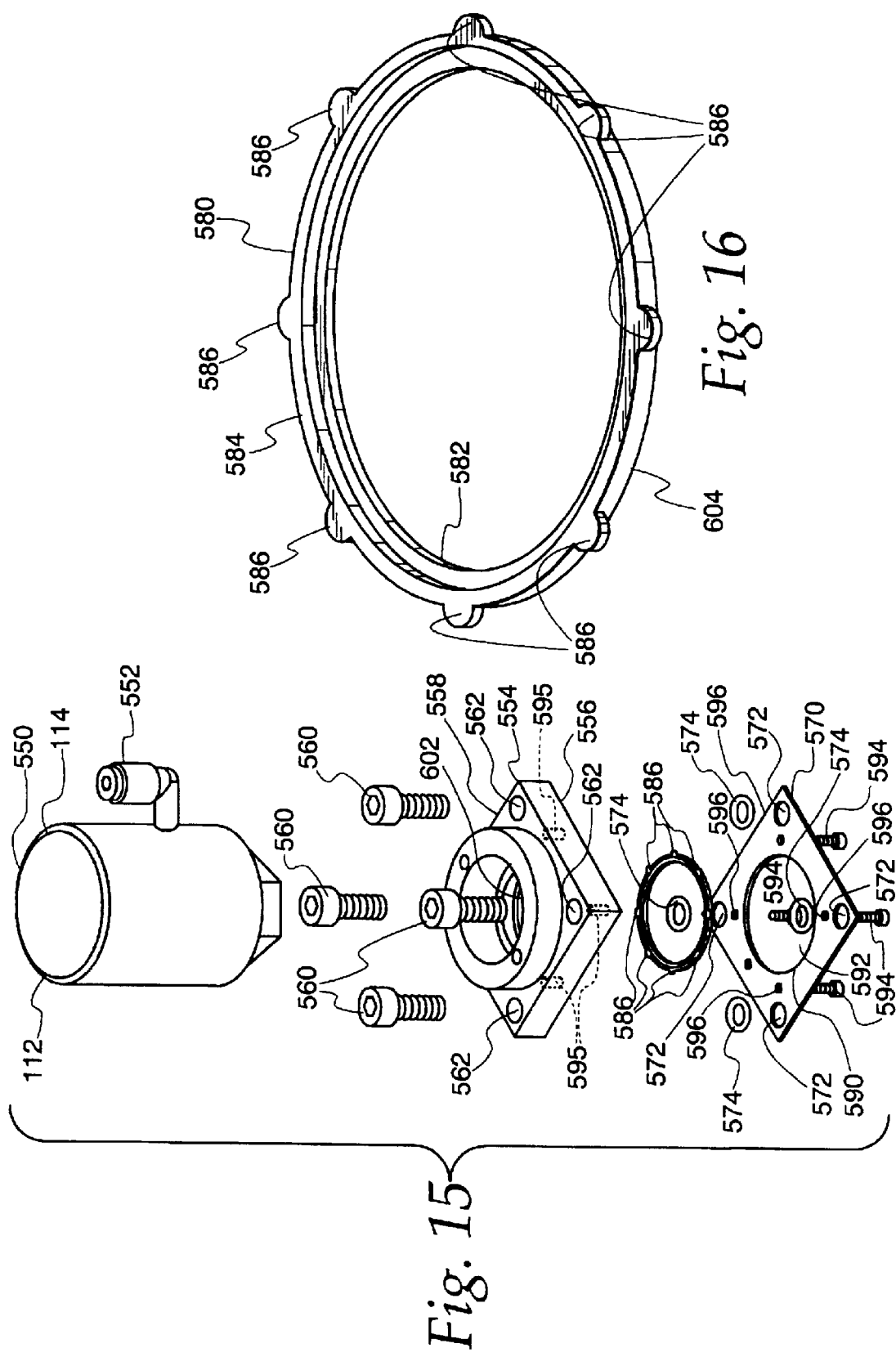

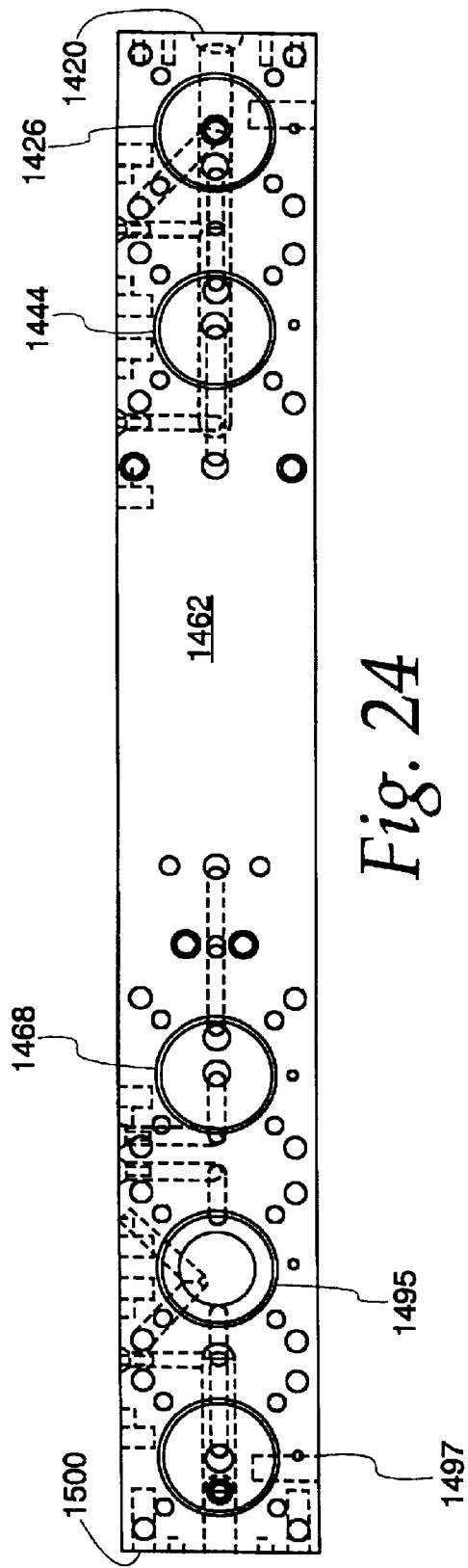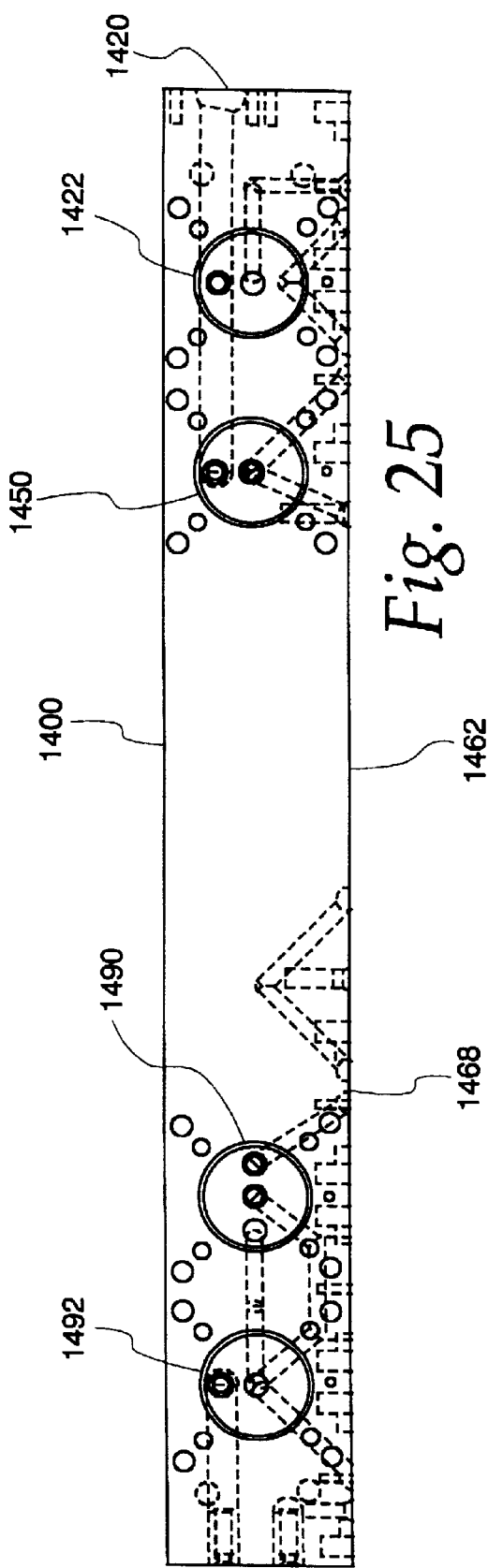

GAS PANEL

This application is a divisional of application Ser. No. 09/371,655, filed Aug. 10, 1999, now U.S. Pat. No. 6,189,570 which is a divisional of application Ser. No. 08/739,936, filed Oct. 30, 1996, now U.S. Pat. No. 5,992,463.

BACKGROUND OF THE INVENTION

The invention relates in general to gas handling systems for semiconductor processing and in particular, to gas panel systems whether of a localized nature or distributed around a semiconductor processing tool.

Wafer fabrication facilities are commonly organized to include areas in which chemical vapor deposition, plasma deposition, plasma etching, sputtering and the like are carried out. In order to carry out many of these processes, it is necessary that the tools which are used for the process, be they chemical vapor deposition reactors, vacuum sputtering machines, plasma etchers or plasma enhanced chemical vapor deposition, be supplied with various process gases which gases may be reactive or inert or provide reactive species.

For instance, in order to perform epitaxial deposition, silicon tetrachloride has bubbled through it a carrier gas such as dry nitrogen, which then carries silicon tetrachloride vapor into an epitaxial deposition chamber. In order to deposit a silicon oxide dielectric coating, also known as a deposited oxide coating, silane ($SiH_4$) is flowed into the tool and oxygen is flowed into the tool where they react to form ($SiO_2$) on the surface of the wafer. Plasma etching is carried out by supplying carbon tetrachloride and sulfur hexafluoride to a plasma etcher tool. The compounds are ionized, to form reactive halogen species which then etch the silicon wafer. Silicon nitride may be deposited by the reaction of dichlorosilane and ammonia in a tool. It may be appreciated that in each instance pure carrier gases or reactant gases must be supplied to the tool in contaminant-free, precisely metered quantities.

In a typical wafer fabrication facility the inert and reactant gases are stored in tanks which may be located in the basement of the facility and which are connected via piping or conduit to a valve manifold box. The tanks and the valve manifold box are considered to be part of the facility level system. At the tool level an overall tool system, such as a plasma etcher or the like, includes a gas panel and the tool itself. The gas panel contained in the tool includes a plurality of gas paths having connected therein manual valves, pneumatic valves, pressure regulators, pressure transducers, mass flow controllers, filters, purifiers and the like. All have the purpose of delivering precisely metered amounts of pure inert or reactant gas from the valve manifold box to the tool itself.

The gas panel is located in the cabinet with the tool and typically occupies a relatively large amount of space, as each of the active devices are plumbed into the gas panel, either through welding tubing to the devices or combinations of welds and connectors such as VCR connectors available from Cajon Corporation or the like.

Gas panels are relatively difficult to manufacture and hence expensive. In a combination VCR connector and welded tubing system the individual components are held on shimmed supports to provide alignment prior to connections at VCR fittings. Misalignment at a VCR fitting can result in leakage.

In addition, it has been found that VCR fittings often tend to come loose in transit and some gas panel manufacturers assume that the VCR fittings have loosened during transit, possibly admitting contaminants to the system.

Welds are relatively expensive to make in such systems but are typically carried out using a tungsten inert gas (TIG) system, having an orbital welding head to weld a tube stub and a tube together. The welding must take place in an inert atmosphere, such as argon, and even then leads to deterioration of the surface finish within the tubes. One of the important characteristics of modern-day gas panel systems and gas handling systems is that the surfaces of the gas handling equipment that tend to have the gas or vapor contact them must be made as smooth and nonreactive as possible in order to reduce the number of nucleation sites and collection sites where contaminants may tend to deposit in the tube, leading to the formation of particulates or dust which would contaminate the wafers being processed.

Additional problems with conventional gas panels relate to the fact that a combination VCR and welded system of the type currently used today typically requires a significant amount of space between each of the components so that during servicing the VCR connections can be accessed and opened. In addition, in order to remove an active component from a contemporary gas panel, many of the supports of the surrounding components must be loosened so that the components can be spread out to allow removal of the active component under consideration.

Most wafer fabricators are aware that it is only a matter of time until, for instance, the silane lines in the gas panels are "dusted." "Dusting" occurs when air leaks into an active silane line causing a pyrophoric reaction to take place yielding loose particulate silicon dioxide in the tube, thereby contaminating the line. Other lines also can be contaminated. For instance, those which carry chlorine gas used in etchers or which carry hydrogen chloride used in other reactions. Hydrogen chloride mixing with moisture present in the humidity of air produces hydrochloric acid which etches the interior of the tube, roughening it and increasing the number of nucleation sites and the likelihood that unwanted deposition would occur inside the tube. In both of these cases, as well as in others, it would be necessary then to open the particular line in the gas panel in order to clean it.

In addition, individual component failures may require a line being opened in order to clean it and is time consuming and expensive.

What is needed, then, is a view type of gas panel which is compact, inexpensive to manufacture and easy to service.

SUMMARY OF THE INVENTION

In accordance with the present invention, a gas panel assembly is provided including a plurality of active device receiving one-piece gas or vapor manifolds. The active device receiving manifolds are arranged so that they receive gas or vapor at an inlet end, pass the gas or vapor along to a plurality of interior channels to a plurality of active device receiving stations which may be connected to an active device or have connected thereto a gas return cap and ultimately deliver the gas or vapor from an outlet for ultimate supply to a tool.

The inventive gas panel assembly is easy to manufacture, in that a standardized manifold is used with a standardized footprint for connection to the active devices. Each of the active device sites is positioned along the face of the substantially rectangular manifold and is oriented to extend at substantially right angles to, the face of the active device manifold and therefore out of the general flow path. Each of the devices is connected to the manifold by a plurality of Allen-head bolts which hold the device base onto the manifold and which may be quickly and easily removed in order to remove a particular device from the system without disturbing other portions of the system.

The manifolding system is also self-aligning, in that each manifold is a repeatable machined component which has been prefabricated. There is no necessity either to provide welded connections or VCR and tube connections directly to the active devices as the connections are made through and support provided by the manifold itself. By tucking within the manifold each of the inlet and outlet connection loops from the manifold between adjacent stations, this greatly saves space and allows a great reduction in the amount of space over that required by a prior gas panel assembly.

The gas panel assembly embodying the present invention is easy to manufacture in that each of the active devices is separately aligned. If misalignment were to occur, for instance, between a pressure regulator and the device receiving station on the surface of a one-piece manifold, an adjacent valve mass flow controller or the like would not be positioned out of alignment with the general manifolding structure as a result thereof. Thus, any misalignment which may occur has been uncoupled from neighboring stations through the use of the manifolding system. Tolerance stack-up problems are also avoided by the simultaneous ability of the manifold to connect with and register the active devices.

Each of the active devices which are connected to the manifold may be prefabricated in that they include a combination seal and screw capture mechanism component, the seal including a keeper for holding the seal in alignment with the active device and the screws being held captured by nylon split rings to hold the screws within the bores of the active device mount. This allows for quick and easy assembly. The active devices are seated upon edge seals at the active sites. The edge seals do not require extensive or fine surface preparation yet provide good, leak-free and contaminant-free joins at the gas flow inlets and outlets between the manifold and the active devices. The seals are easily removable for replacement during repair. They include keepers for self-locating which is particularly helpful when replacing an active device on a manifold face in the field.

The inventive gas panel manifold system also allows an entire manifolding assembly, or stick, to have applied thereto heated tape or other types of heaters in order to heat all of the manifold bores extending among..the active device components and maintain a low vapor pressure gas or vapor in a vapor state throughout each of the process gas lines of the system.

The inventive gas panel manifolding system allows the gas panel to be easily reconfigured by a user in the field as welds and VCR connections need not be broken. An active device may be replaced or added simply by lifting it out of connection with an active device site and a new one connected thereto.

A pair of nitrogen purge inlets is provided, both at the upstream and the downstream end of the one-piece manifolds so that should it be necessary to remove an active device from the manifold, dry nitrogen can be blown both backward and forward through the manifold. Dry, clean nitrogen would exit at both the exposed inlet and outlet ports the active device site and contamination of the rest of the manifold during the course of the changing of the active device site be eliminated.

In addition, in a particular embodiment of the present invention the manifolded gas panel system includes pressure transducers having visual digital readouts so that the pressure can be directly viewed by an operator at the site as well as transmitted to a control computer.

In an additional feature of the present device, the gas panel system is enclosed within a gas panel housing having a floor, sides and a cover. Extending across the floor of the gas panel housing is a plurality of threaded mounts adapted to engage mounting apertures in the ends of each of the gas panel manifolds. The mounts allow the upper surfaces of the manifold, which receive the active devices, to be individually aligned into a single plane. This allows a rapid assembly of active devices across the gas panel system and allows bridging connectors to be easily aligned with the overall gas panel active device plane defined by each of the manifolds. The single device plane construction also provides easy access to the Allen head bolts holding the active devices to the manifolds.

U-tube type bridge connectors, having long-connector legs and short cross tubes connected together by Cajon elbows for interconnecting successive manifolds to bridge various manifolds, provide a route for purge gas, such as nitrogen. The long tubing provides mechanical advantage allowing limited flexure of the short bridging tube. The U-tube connection is thus dimensionally forgiving for any slight misalignment which may occur in the horizontal plane defining the active device surfaces. It may also be appreciated that a snug fit is not provided between the threaded support fasteners and the active device manifolds to allow a slight amount of horizontal play between the manifolds for easy U-tube connection therebetween. The U-tube may also be formed by bending a tube into a U-shaped configuration which would avoid the necessity of welding.

The ability to suspend the manifolds above the surface of the gas panel enclosure allows circulation of purge and vacuum air around assemblies. Many building codes for wafer fabrication facilities require prescribed amounts of purge air to sweep leaked process gas out of the housings of the gas panels for safe disposal. The improved sweep provided by the suspension of the manifolding assemblies above the floor aids in the isolation of any leaks which may occur within the gas panel system from the wafer fabrication operators.

BRIEF DESCRIPTION OF THE DRAWINGS

FIG. 10 is an exploded perspective view of a bottom block of the mass flow controller showing details of its assembly with a gas panel manifold;

FIG. 11 is a perspective view of a deformable edge-type seal element shown in FIG. 10;

FIG. 12 is an exploded perspective view of a keeper and C-ring seal;

FIG. 13 is a perspective view of the keeper shown in FIG. 12 engaging the C-ring seal;

FIG. 15 is an exploded perspective of a pneumatic control valve showing details of a flange mounting assembly for coupling with a gas manifold;

FIG. 16 is a perspective view of an edge-type seal used in the assembly shown in FIG. 15;

FIG. 24 is a top elevation, with portions in phantom, of the manifold shown in FIG. 23;

FIG. 25 is a side elevation, with portions in phantom, of the manifold shown in FIG. 23.

DETAILED DESCRIPTION OF THE PREFERRED EMBODIMENTS

Figure 1:
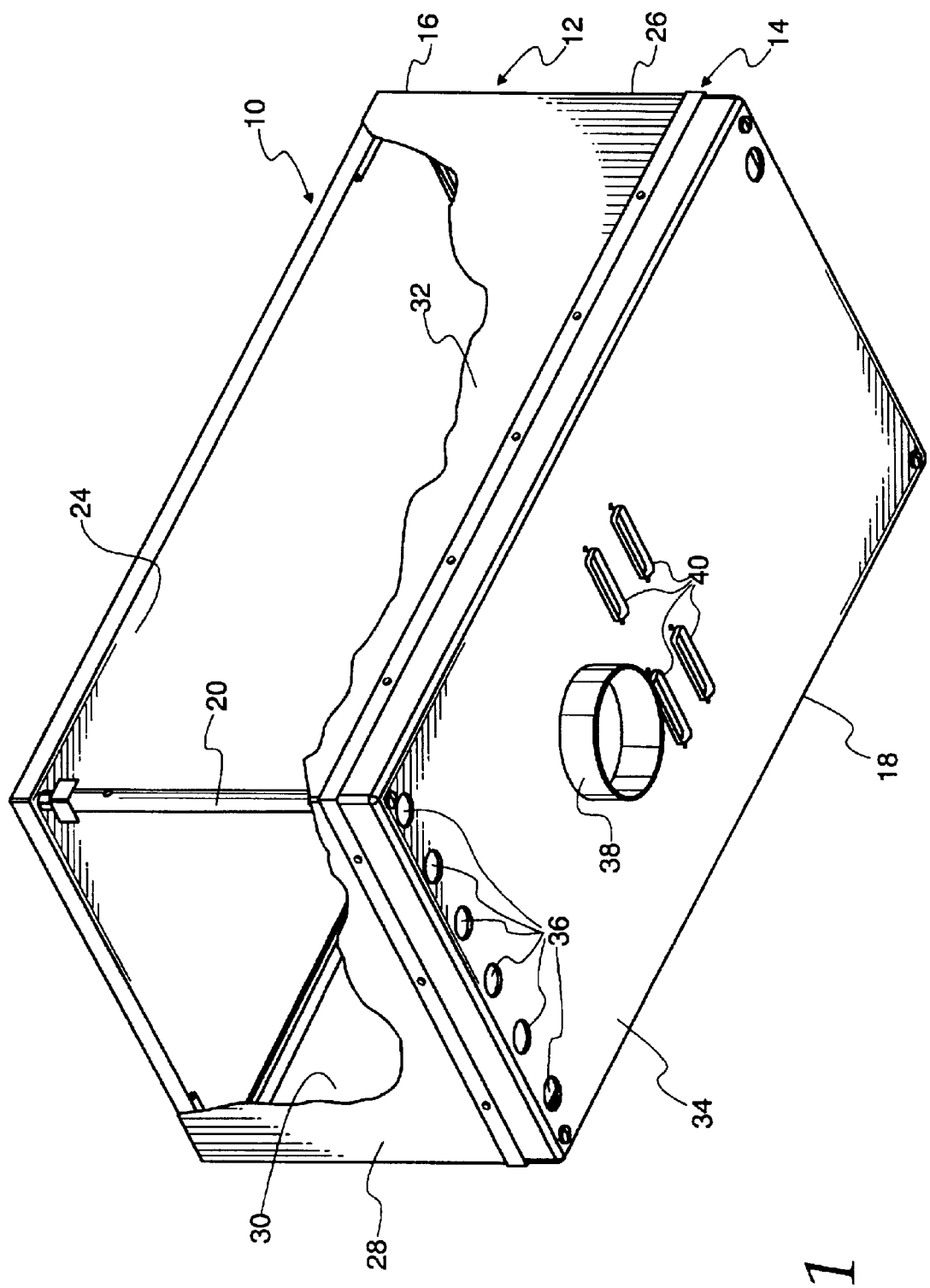
FIG. 1 is a perspective view of a gas panel system including a housing and a gas panel mounting plate.

Referring now to the drawings and especially to FIG. 1, a gas panel assembly, generally identified by numeral 10, is shown therein and includes a gas panel housing 12 having a gas panel 14 positioned between an upper housing half 16 and a lower housing half 18. The gas panel assembly receives multiple process gases from a source and provides them to a tool for fabricating a semiconductor wafer.

The housing is adapted to confine gases which may leak from the gas panel 14 to the immediate vicinity of the gas panel and to carry them away efficiency. In order to confine the gases, the gas panel itself has extending therefrom a plurality of posts 20 which contact a top wall 24 of the upper portion of the housing 16. The housing also includes a pair of end walls 26 and 28, a back wall 30 and a front wall 32. The bottom housing 18 includes a bottom wall 34 having a plurality of inlet apertures 36 formed therein adapted to receive gas flow lines coupled to other portions of the gas panel 14. The apertures 36 are sized significantly larger than the diameter of the gas flow lines to also function as sweep air inlets into the housing 12. Swept air is exhausted through an exhaust plenum 38 which may be coupled to a suitable low pressure or vacuum source. A plurality of electrical connections 40 is also positioned in the bottom wall 34 to allow wiring to be connected to portions of the gas panel 14.

Figure 2:
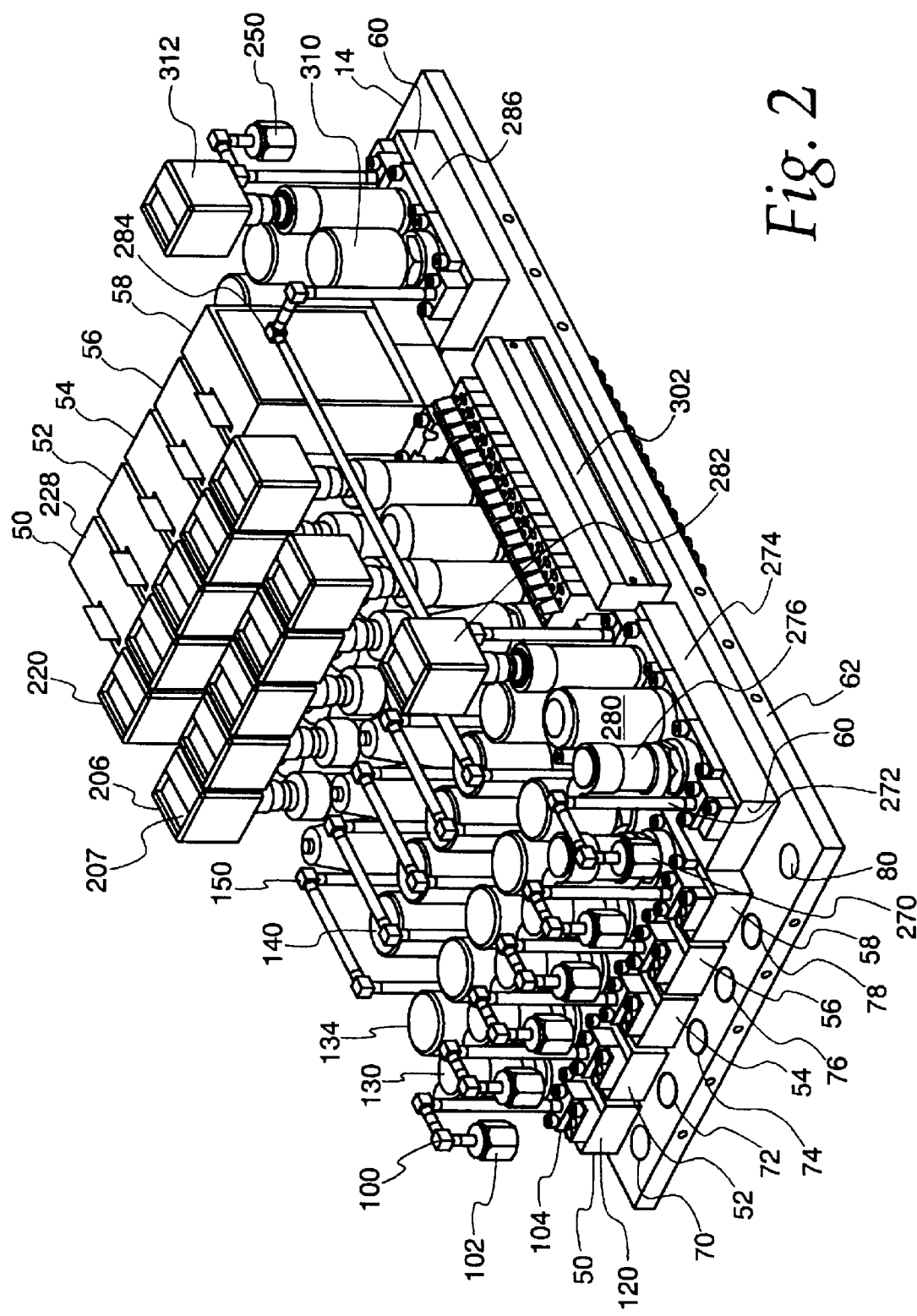
FIG. 2 is a perspective view of the gas panel shown in FIG. 1.
Figure 3:
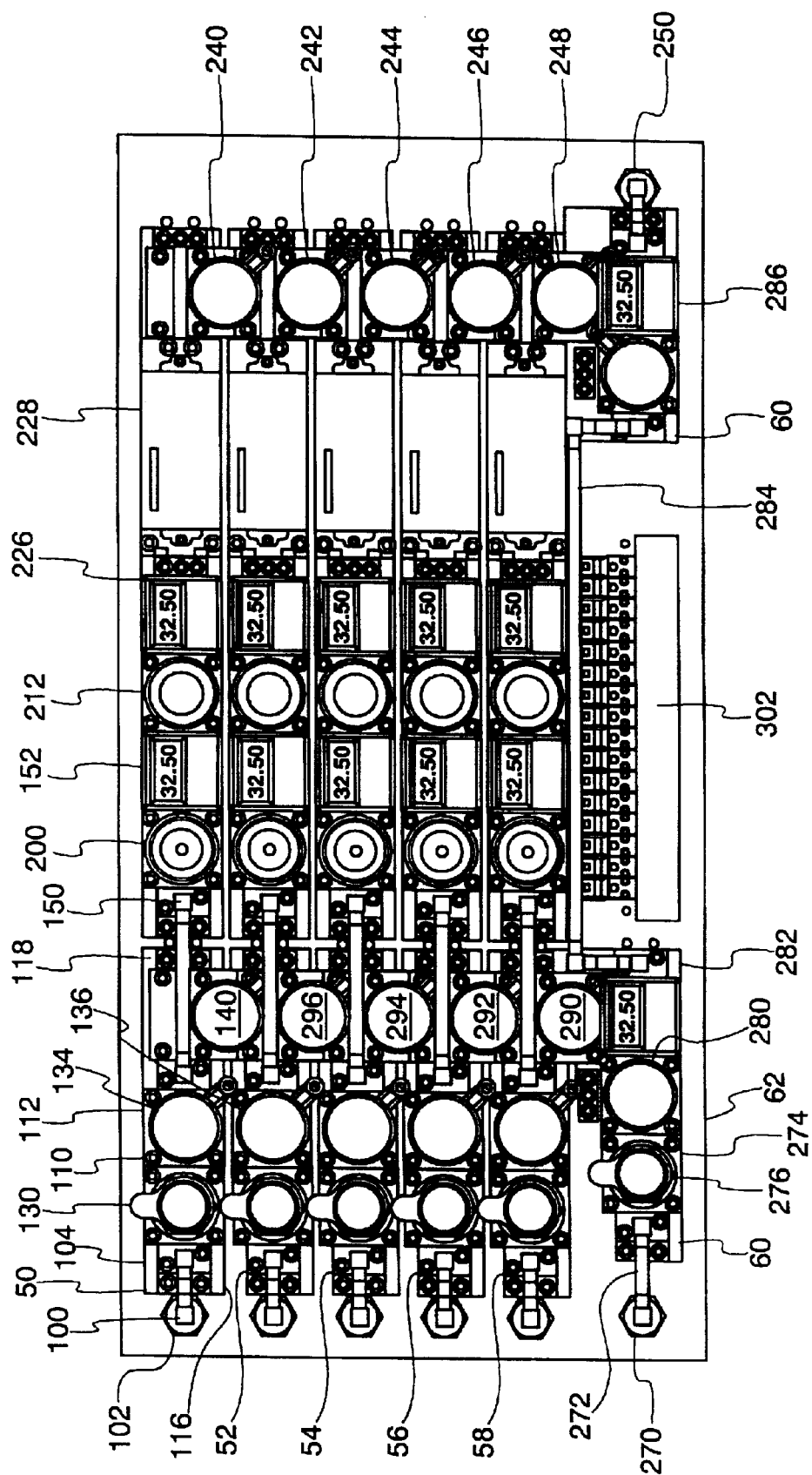
FIG. 3 is a top elevational view of the gas panel shown in FIG. 2.
Figure 4:
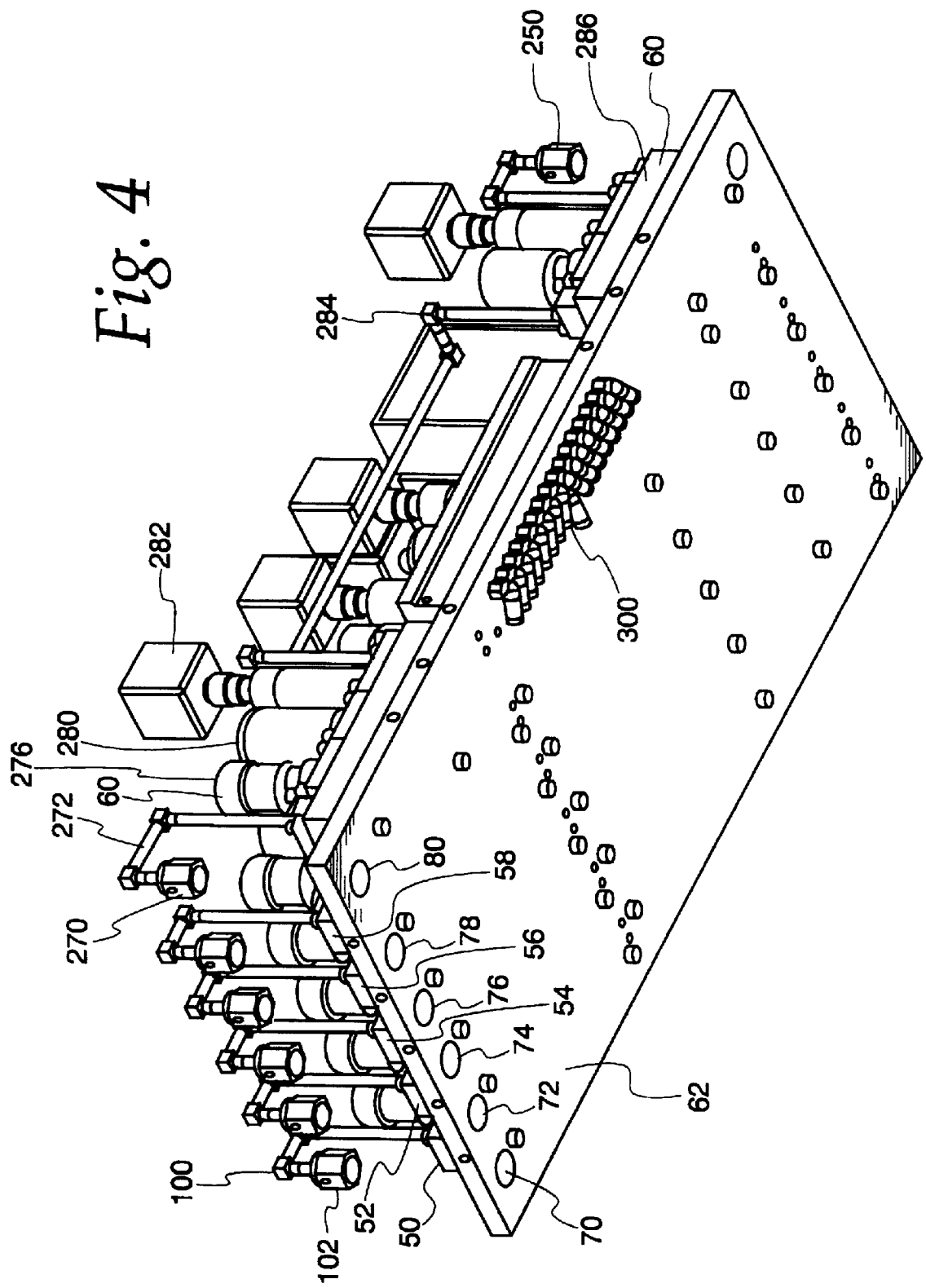
FIG. 4 is a perspective view of a bottom portion of the gas panel shown in FIG. 2.

As may best be seen in FIG. 2, the gas panel 14 is shown therein and has a plurality of process gas sticks or process gas assemblies 50, 52, 54, 56 and 58. A nitrogen purge gas assembly 60 is also positioned on an aluminum platform 62. The aluminum platform 62 has tubing inlet bores 70, 72, 74, 76, and 78 as well as a purge gas bore 80 formed therein for connection to inlets of each the gas sticks. The process gas sticks 50, 52, 54, 56 and 58 are substantially identical. Each of the sticks includes an inlet 100 as is shown in the exemplary stick 50. The inlet 100 comprising a U-shaped tube having a threaded portion of a VCR fitting 102 connected thereto. The U-shaped tube 100 is coupled to a tube base 104 which is coupled to an inlet manifold 118 are shown. The manifold also includes an end wall or face 120. Each of the sticks includes a plurality of active devices or gas components.

A process gas such as silane or the like is delivered from a line connected to nut 102 through the U-tube 100 and into the base 104 where it is delivered to the inlet manifold. A manual valve 130, comprising one of the active devices or gas components and mounted on the base, may be turned to close transmission for the process gas through the manifold. The manifold has a plurality of bores formed therein, which bores are in communication between the inlet 100 and the valve 130. The gas is then passed to a pneumatic valve 134 which is controllable through a pneumatic stem 136 from a suitable source of pneumatic gas. A purge valve 140 is connected through a bridging U-tube 150 to a second manifold 152.

Figure 5:
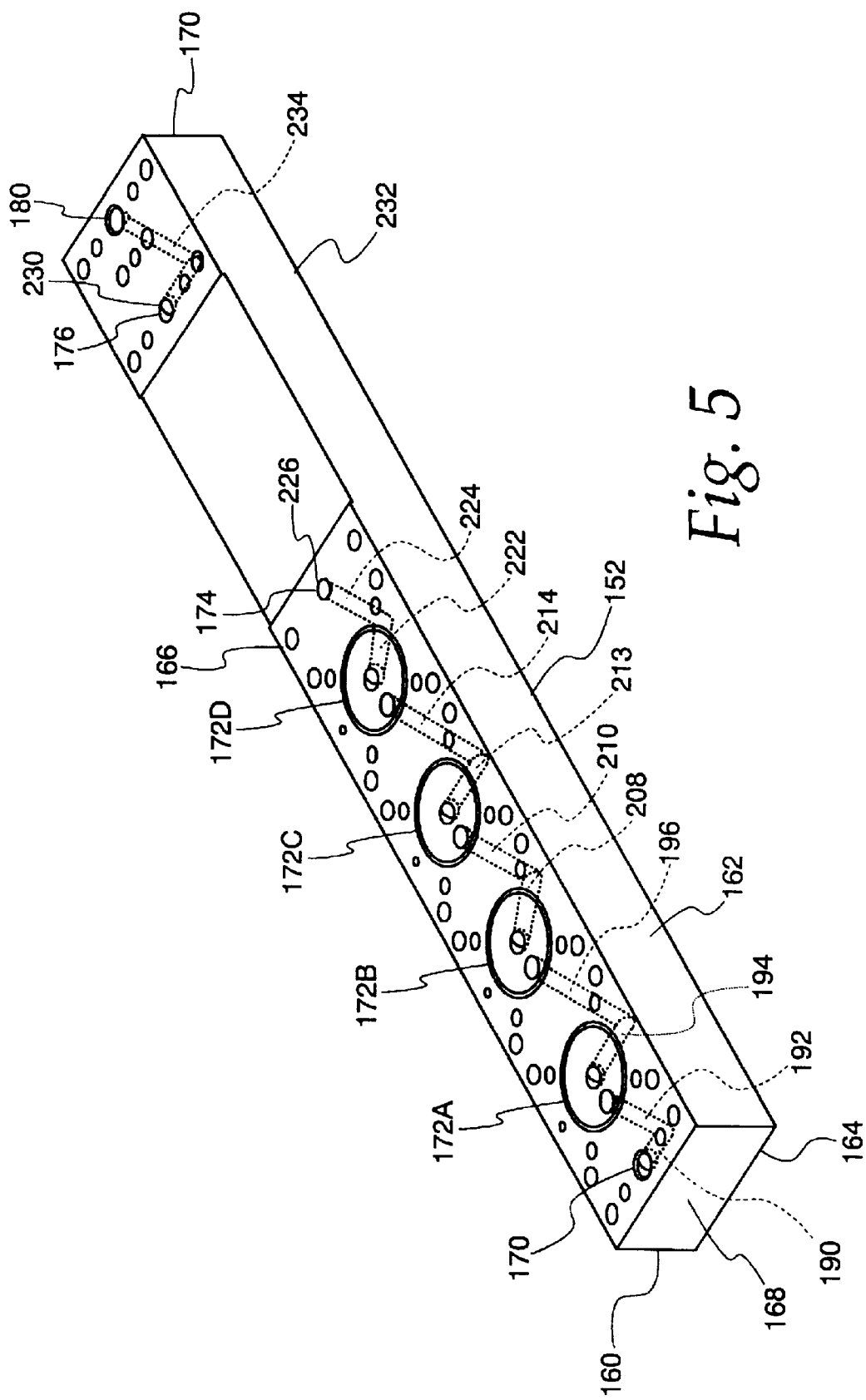
FIG. 5 is a perspective view, with portions shown in phantom, of a gas manifold shown in FIG. 2.

Elongated rectangular manifold 152, as shown in FIG. 5, includes a pair of sidewalls 160 and 162, a lateral bottom wall 164, a lateral top wall 166, and end walls 168 and 170. The manifold is substantially unitary and comprising a solid piece defining an inlet station 170 and a plurality of active device stations 172a–172f extending there along, including a mass flow controller station 174, second mass flow controller station 176, and an outlet station 180. It may be appreciated that successive stations are connected by bores drilled into the block or manifold 152.

The bendable element 150 is connected to the inlet 170 and delivers gas to a bore 190 which is coupled to a second bore 192 providing an inlet tube to first active device station 172a. The first active device station 172a has a pressure regulator 200 mounted on it, which receives gas from the bore 192 and delivers gas with reduced pressure back through the bore 194, which is then delivered to a bore 196. The gas is supplied to second station 172b having a pressure transducer device 206 positioned thereon. The pressure transducer 206 has a visual read-out 207 for providing a visual indication or the pressure to a user it also has an electrical signalling connection for sending a pressure signal off panel. The flow of gas continues through a bore 208, to a bore 210 and delivered to a third station 172c to which a filter/purifier 212 is mounted.

The filter/purifier removes moisture from the gas stream and delivers the dried gas stream back through a bore 213, to a bore 214. The dried gas supplied through the bore 214 to the active device station 172 is delivered to a pressure transducer 220 which then delivers the gas after measuring the pressure to a bore 222, supplying gas to a bore 224, which is coupled by an aperture 226 to an inlet of a mass flow controller 228. The mass flow controller 228 meters the flow of gas in accordance with electrical signals it receives.

It delivers the metered gas output to an aperture 230 which supplies the metered output of the gas to a bore 32, coupled to supply gas to a bore 234 providing gas at the outlet 180. The outlet 180 has connected to it a pneumatic valve 240 which is connected by a bridging connectors through chained pneumatic valves 242, 244, 246 and 248, which selectively allowed gas to flow to an outlet line 250 for delivery off the gas panel.

In addition, purge gas, such as dry nitrogen or argon, can be received at the purged gas inlet 270, supplied by a U-tube 272 to a purge gas rectangular manifold 274, having laterally extending faces including a manual valve 276 positioned in communication with bores therein to enable or disable purged gas, such as nitrogen from traveling through the remainder of the manifold 274. A pneumatic valve 280 couples the gas to a pressure transducer 282, which then may feed the gas through either an elongated U-tube 284 to other portions of the purged gas manifolding system 60, including an outlet manifold 286. It also may feed the gas through a plurality of pneumatic valves 290, 292, 294, 296 or the pneumatic valve 140, which are coupled by bridging elements to supply purge gas to the center manifolding sections of the gas sticks 50, 52, 54, 56 and 58. The pneumatic valves are controlled by a plurality of pneumatic lines 300, which are driven from an electrical control block 302, which receives electrical inputs from a suitable outside source.

The purge gas is then delivered through the U-tube into the block 286, where it passes through a pneumatic valve 310 and a pressure regulator 312, and is delivered to the outlet 250. It may be appreciated that the valves may be cycled in such a manner that purge gas may be flowed both into the inlet valve stack side, including valves 290 through 296 and 140, and the outlet stack side, valves 240 through 248, causing purge gas to sweep inwardly from both ends of the manifold 152, keeping the manifold clean while a repair is taking place.

Figure 7:
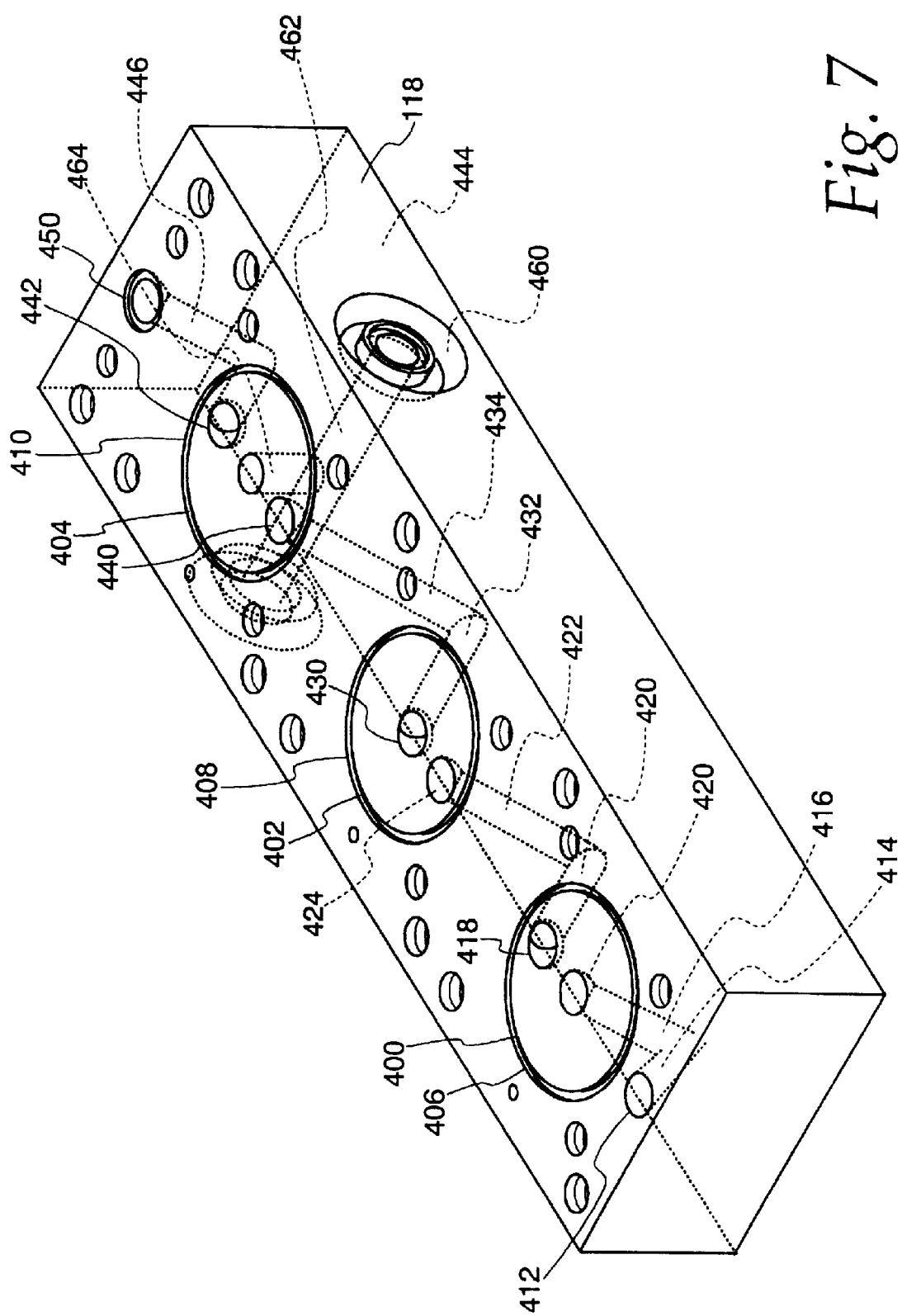
FIG. 7 is a perspective view of an inlet gas panel manifold for an alternative embodiment.

As may best be seen in FIG. 7 an alternative embodiment of an inlet manifold includes a first active device site 400, a second active device site 402, and a third active device site 404. Each of the sites 400, 402 and 404 includes an outer circumferential ring respectively, 406, 408 and 410 for engagement with an outer edge type connector. The U-tube inlet is connected to an aperture 412 to feed gas through a bore 414 to a second bore 416 which delivers the gas to an inlet 420.

The gas then flows through the manual valve 130 and is delivered to an outlet aperture 418 which supplies a gas through a bore 420 to a second slanting bore 422, coupled with the active site 402. The bore 422 is connected to an aperture 424 for supplying gas to the pneumatic valve 134 and the gas exits the pneumatic valve-134 at an opening 430 which supplies gas to a bore 432 connected to a bore 434.

A second pneumatic valve may be coupled at the site 404 which pneumatic valve is a three-way valve able to receive process gas such as silane or the like from the bore 434 which is delivered to the valve at the aperture 440. In one state, the valve will then transfer the process gas to its outlet aperture 442, which supplies the gas to a bore 444 and a bore 446 to deliver the gas to a manifold outlet 450 coupled to the jumper 150. However, in another mode, purge gas may be received at the aperture 460 and supplied by a transverse bore 462 to a vertical bore 464 to the valve and thereby supply either backward through the bore 434 or in most practical applications, forward through the aperture 442 for flushing of other parts of the line. In addition, since the inlet manifold block is exemplary of all manifold blocks, the transfer bore 462 is used for transferring gas across blocks so that nitrogen from the nitrogen manifold 60 may be transferred across all of the inlet blocks via the transverse bores.

Figure 6:
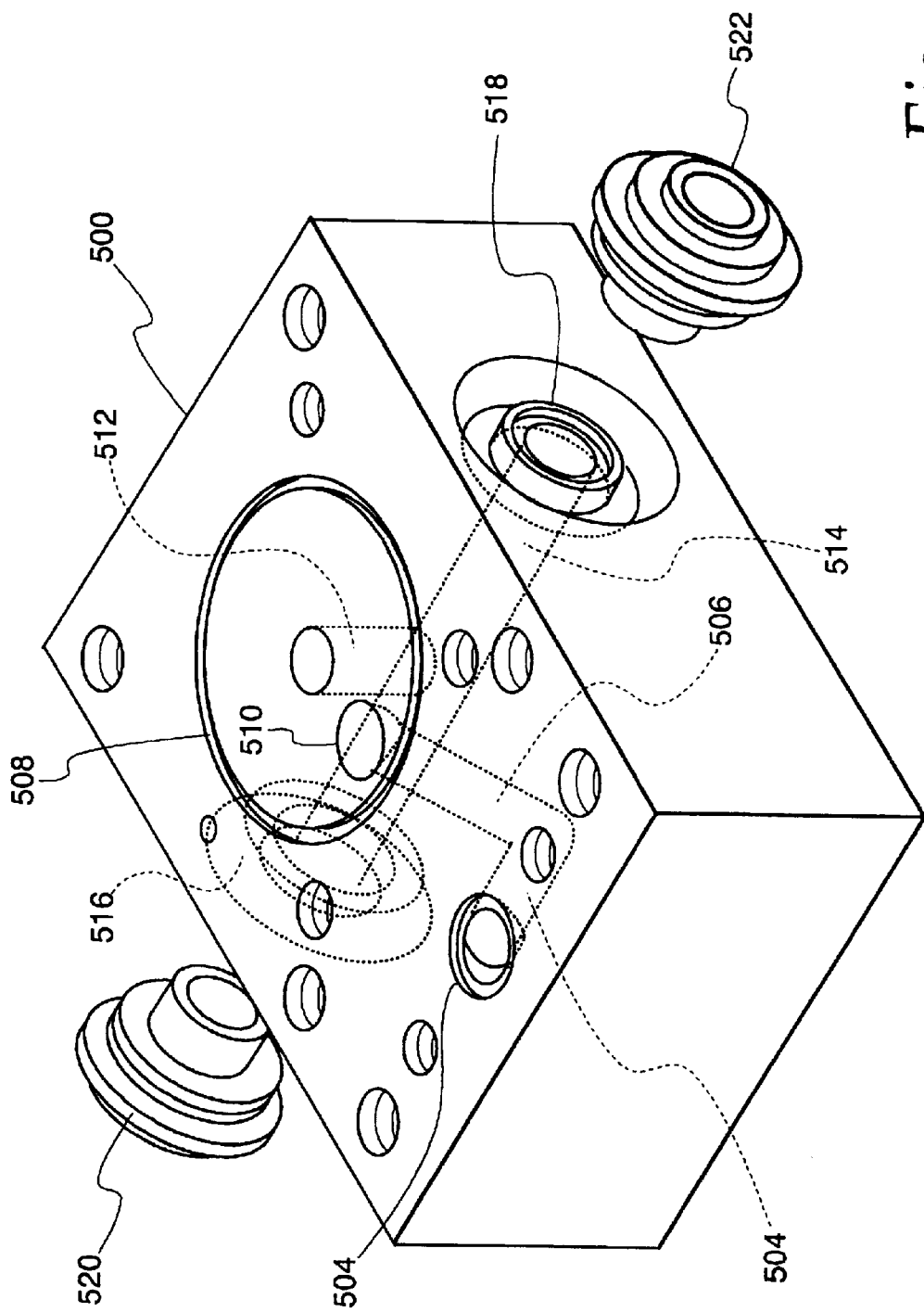
FIG. 6 is an exploded perspective view, with portions shown in phantom, of an outlet gas panel manifold for an alternative embodiment.

An alternative embodiment of an outlet manifold 500 is shown in FIG. 6 and includes an inlet bore 502 for receiving gas from a mass flow controller, regulated gas flow is then transferred through a slanting bore 504 to a second slanting bore 506 and delivered to an active device site 508 to which a valve is connected. The gas is delivered to an aperture 510 for delivery to a valve such as the valve 240 or the like. The gas is then delivered downward through a vertical bore 515 to a transverse bore 514, terminating in a first bore coupling 516 and a second bore coupling 518. Fittings 520 and 522, respectively connected to the bore couplings for delivery of gas transversely so that a selected gas may be supplied through the panel through the single outlet 250.

As may best be seen in FIGS. 15 and 16, a typical pneumatic valve, such as the pneumatic valve 112, includes a valve actuator 114, which is commercially available. The valve actuator has valve components which communicate through a pneumatic interface fitting 552, which is coupled by a pneumatic line to the pneumatic manifold. The valve 112 is connected to a flange 554, having a rectangular base 556, and a valve accepting collar 558. A plurality of manifold mounting bolts 560 extend through apertures 562 for connection with the gas manifold block.

The valve 112 may be preassembled with seal elements attached to it through the use of a prefabricated keeper 570 which is substantially rectangular and includes a plurality of apertures 572 through which the bolts 560 extend. The bolts 560 are trapped by nylon split rings 574 which lightly engage the bolts, but hold them in the bores 562 so that after preassembly the bolts will not fall out and the unit can be packaged together.

A seal ring 580, having a ring proper 582, for effecting sealing engagement between the valve and the manifold, includes a ledge 584 having a plurality of semicircular tabs 586 positioned thereabout. The tabs 586 engage an edge or shoulder 590, which defines an aperture 592 and the keeper 570. The keeper 570 receives a plurality of small bolts 594 at respective apertures 596, which are in registration with apertures formed in the bottom of the rectangular base 556 of the flange 554, which holds the keeper against the bottom of the flange 554. The bolts 594 engage threaded and counterbored apertures 595 formed in the flange 554. The threaded bores 595 act as a holder or retainer for coupling the keeper 570, and hence the seal ring 580 to the bottom 556 of the flange 554 prior to assembly with the manifold block.

The sealing ring 580 extends slightly below the keeper 570 but is trapped in registration with an opening 602 in the bottom of the flange and extends slightly below the keeper at an extension portion. At best, the unit may be completely preassembled and may be quickly added to the manifold. The flange type base is exemplary of similar flange type bases used throughout the manifolding system wherein the flange may be preassembled with seal rings held securely by keepers.

Figure 17:
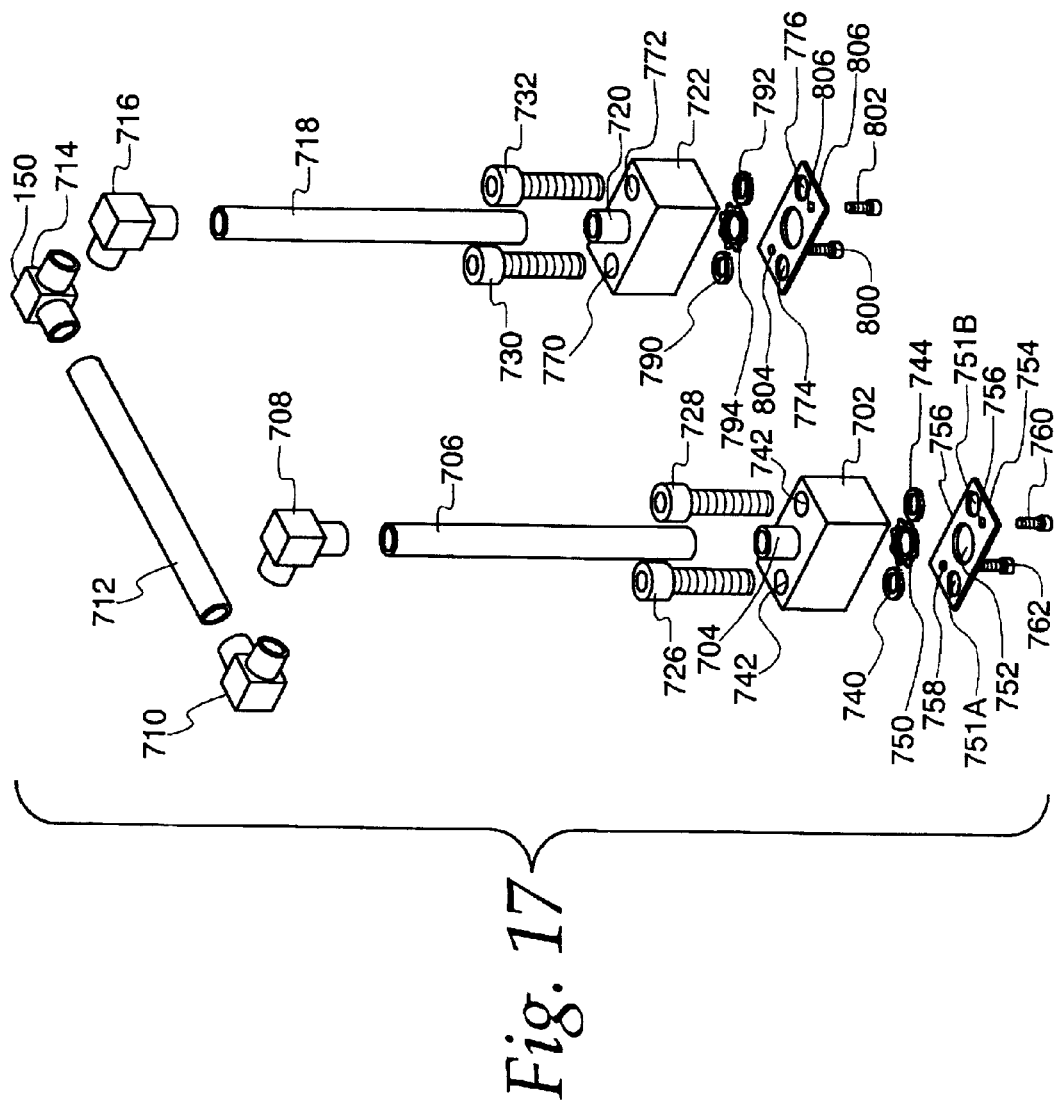
FIG. 17 is an exploded perspective view of a jumper conduit.
Figure 18:
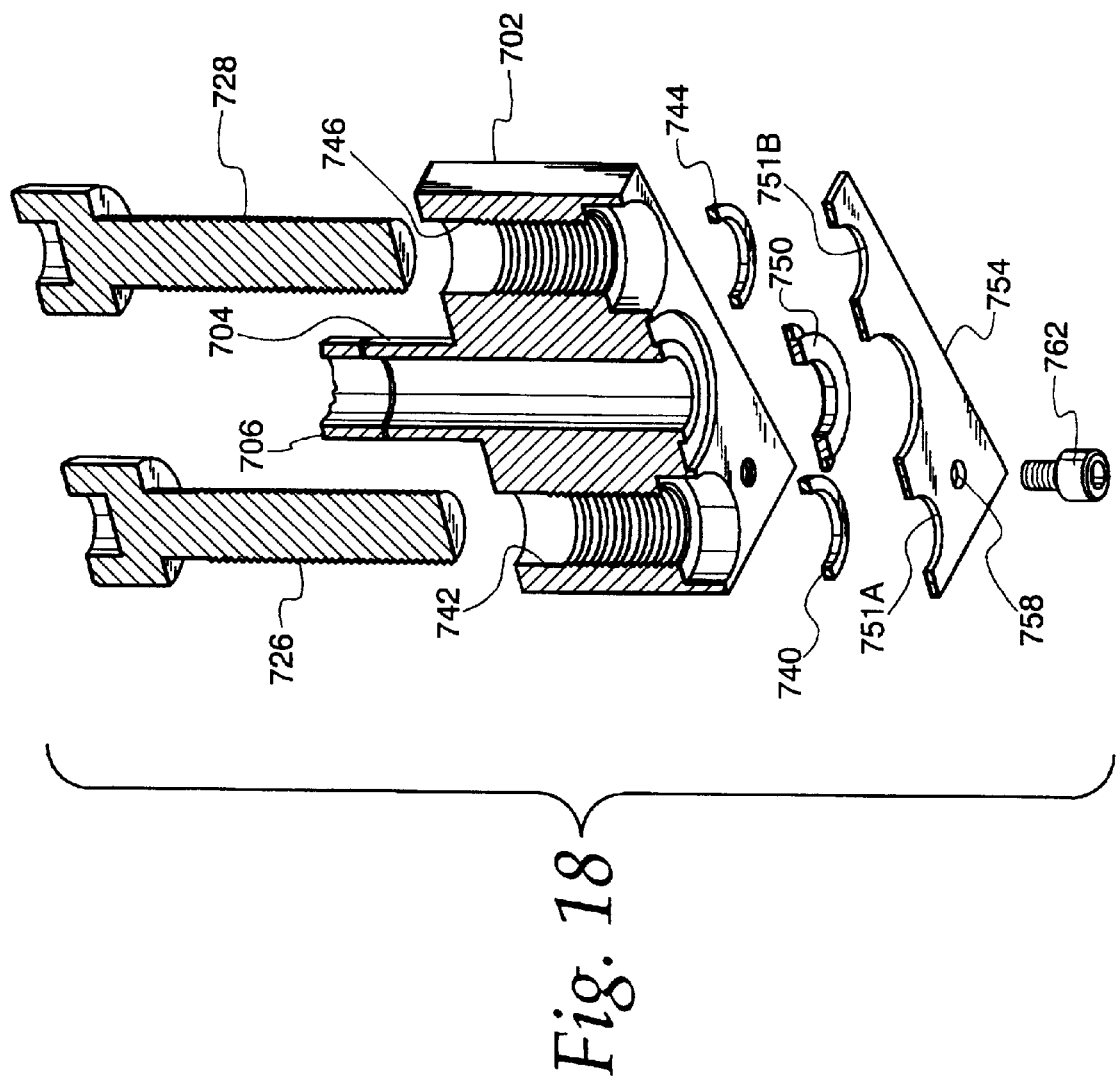
FIG. 18 is a view, partially in section, and exploded, of details of a connection fitting of the jumper conduit shown in FIG. 17.

Another example of such an arrangement is shown in FIGS. 17 through 18, wherein a typical jumper, such as the jumper 150, is shown therein. The jumper 150 includes an inlet block 702 having a stem 704 for connection in gas conducting contact with a tube 706. An elbow 708 is welded to the tube 706 and a second elbow 710 carries gas from the elbow 708 to a cross piece tube 712. A first return elbow 714 is connected to a second returned elbow 716 to deliver gas to an outlet tube 718 coupled at a tube fitting 720 to a block 722. Each of the blocks 702 and 722 includes respective bolts 726, 728, 730 and 732, which extend through the block. Bolt 726 is held by a plastic split ring 740 within a bore 742 of the block. The bolt 728 is held by a split ring 744 within a bore 746 of the block 702. A tabbed seal table ring 750 is positioned in a ring keeper aperture 752 of a metal keeper 754. The keeper 754 has a pair of keeper mounting bolt apertures 756 and 758, which receive keeper mounting bolts 760 and 762 to hold the keeper and to trap the seal ring 750 in registration with the opening from the tube 704 into the keeper and ultimately into the manifold. Likewise, the bolt 730 extends through a bolt aperture 770. The bolt 732 extends through a bolt aperture 772 into apertures 774 and 776 of a keeper 780. The bolts are held in light engagement prior to assembly by snap rings 790 and 792 and keeper 780 holds a seal ring 794 in engagement with the bottom of the block via the bolts 800 and 802, which extend through apertures 804 and 806 of the keeper.

Figure 21:
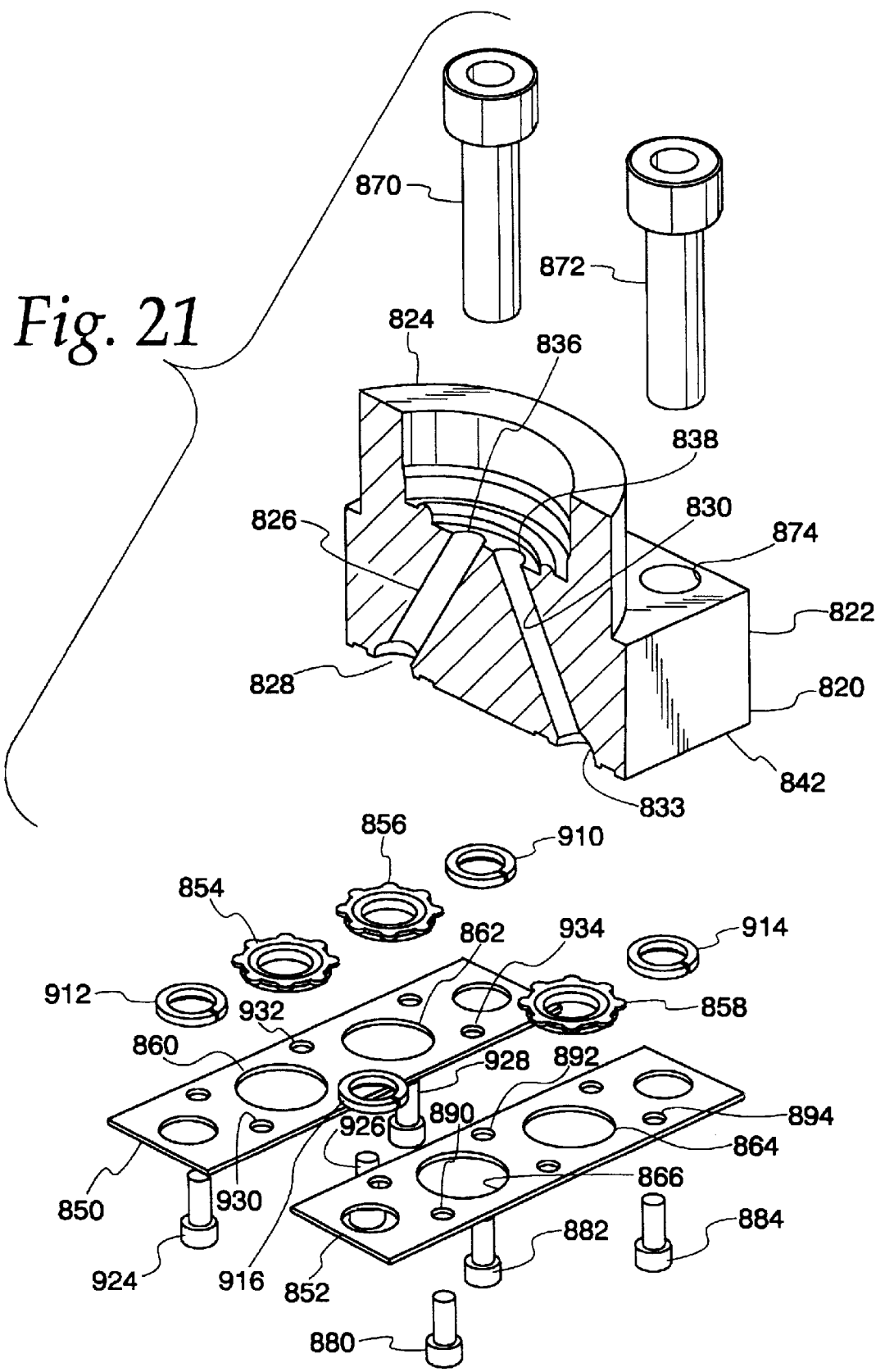
FIG. 21 is an exploded perspective view of a flange or coupling a valve to a gas manifold.
Figure 22:
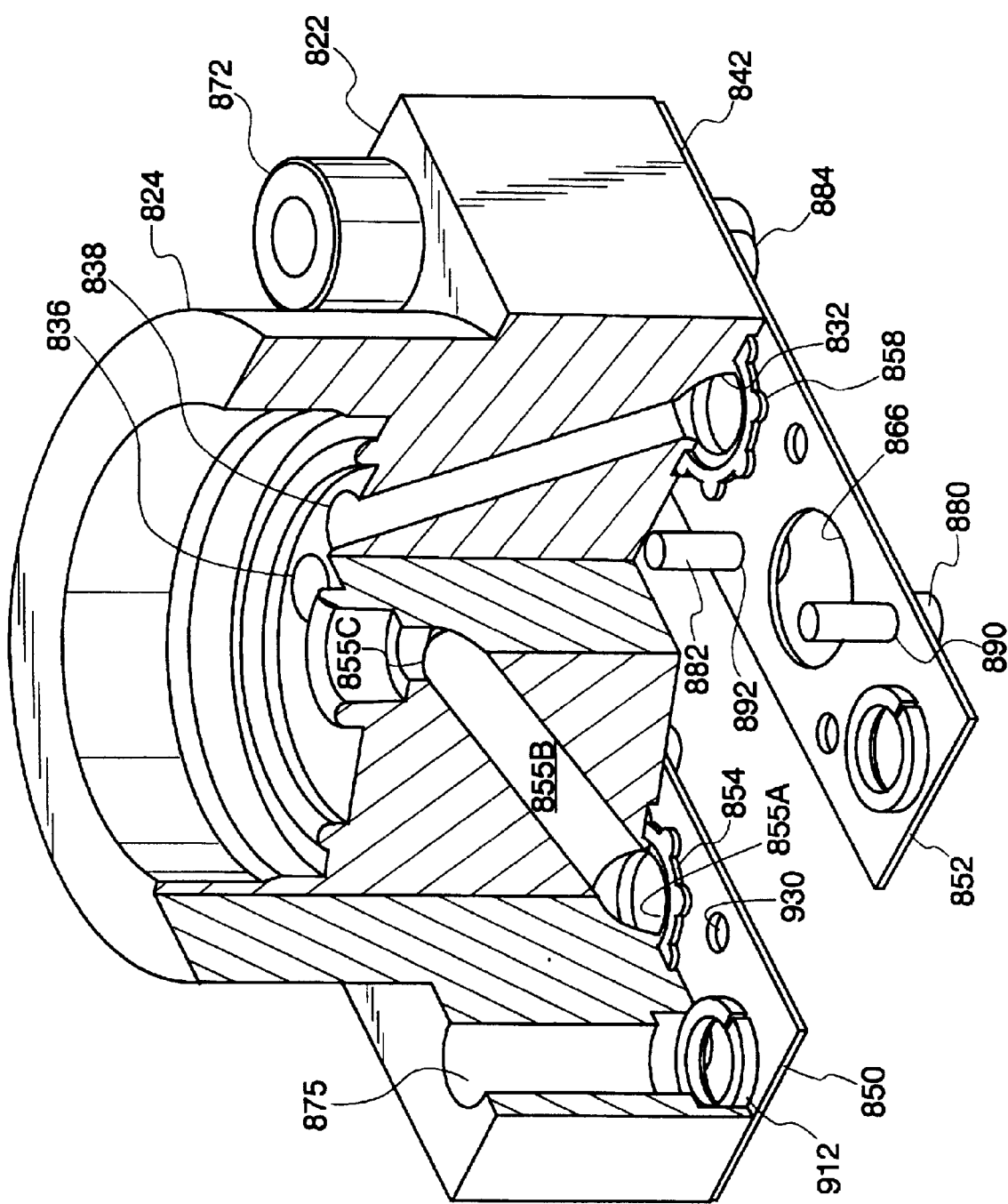
FIG. 22 is a section view of the flange shown in FIG. 1.
Figure 23:
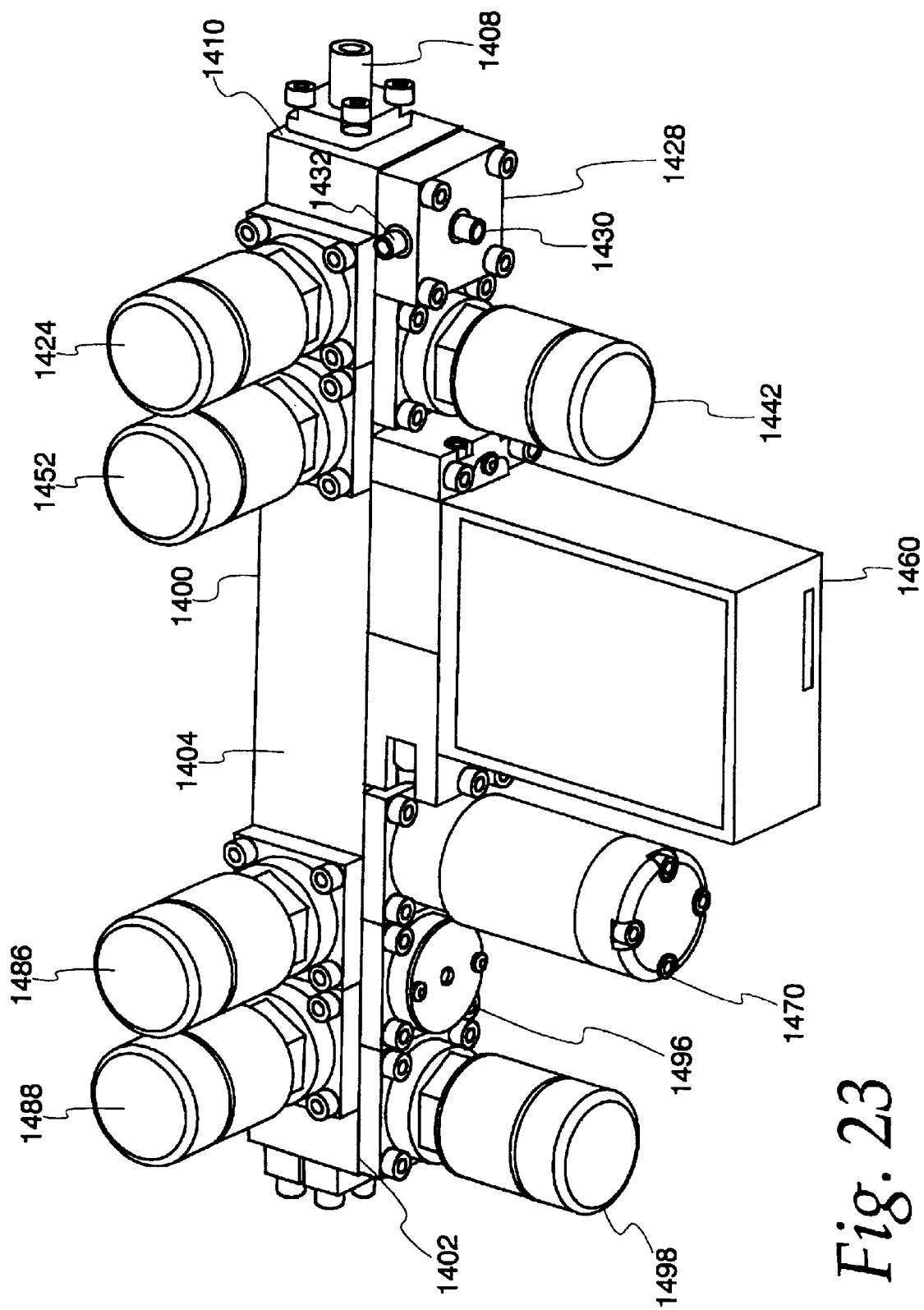
FIG. 23 is a perspective view of an alternative embodiment of an assembly gas manifold.
Figure 26:
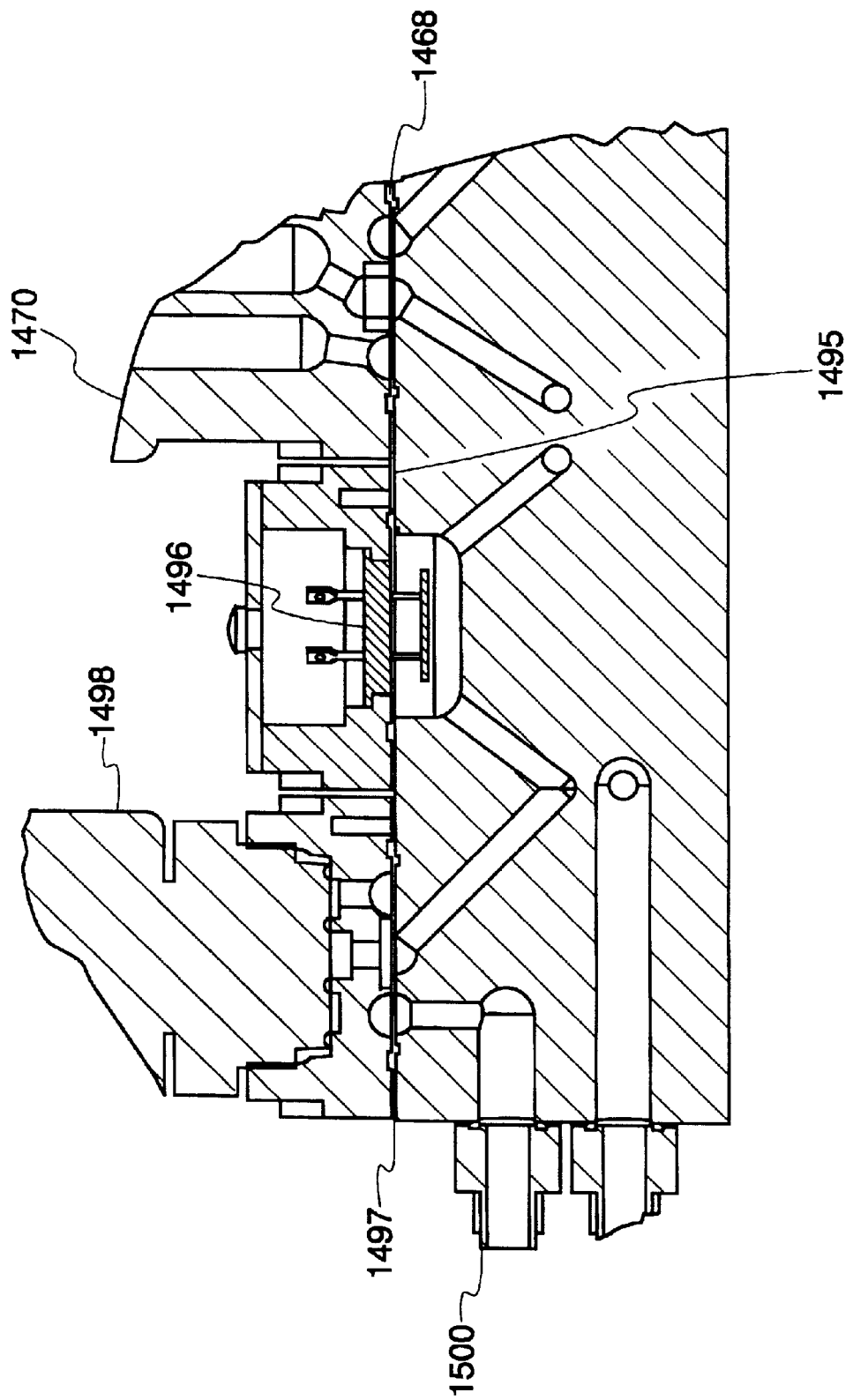
FIG. 26 is a section of a portion of the assembled gas manifold shown in FIG. 23.

An alternative embodiment of a flange for use with a multiple port or three-way valve such as an Aptech 3550, valves 140, 290, 292, 294 and 296, may best be seen in FIGS. 21 and 22. A valve flange 820 includes a flange base 820 to having an upstanding cylindrical flange section for contact with a valve such as a pneumatic valve or the like. A first bore 826 extends between a gas connection aperture 828 and a second bore 830 extends to a gas connection aperture 832. Both apertures 828 and 832 terminate bottom ends of the bore. The upper end of the bore 826 terminates in an aperture 836. The upper end of the bore 830 terminates in an aperture 838. The bores 828 and 832 are at a bottom portion 832 of the flange bottom 822.

A pair of metal keepers 850 and 852 are substantially rectangular hold a plurality of edge type seals 854, 856 and 858. The seal 854 is positioned at an opening 855*a* of a bore 855*b* extending to a bore aperture 855*c*. The seal 856 is positioned at the aperture 828 and the seal 858 is positioned at the aperture 832. The seal 854 sits in a sealing receiving aperture 860 of the keeper 850. The seal 856 sits in a sealing ring receiving aperture 862 of the keeper 850. Seal ring 858 sits in a keeper receiving aperture 864 of keeper 852, and keeper 864 also includes a spare or extra aperture 866 which may be used in other applications.

A plurality of keeper holding bolts 880, 882 and 884 extend through respective apertures 890, 892 and 894 of the keeper 852 and to contact with the flange 822. A plurality of split rings 910, 912, 914 and 916 contact the threaded fasteners including threaded fasteners 870 and 872 for mounting a flange on the gas panel. In order to hold the threaded fasteners within the threaded fastener bores including the bores 874 and 875, a plurality of keeper bolts 924, 926 and 928 extends through apertures 930, 932 and 934 to secure the keeper 850 and the accompanying seal rings 854 and 856 against the bottom of the flange 852. Thus, the entire flange assembly provides highly localized apertures for connection to a manifold body. Each aperture has associated with it a relatively small seal ring for the prevention of leakage between the respective bores 830, 826 and 855*b*, and the manifold. This allows leaks to be easily detected.

Figure 8:
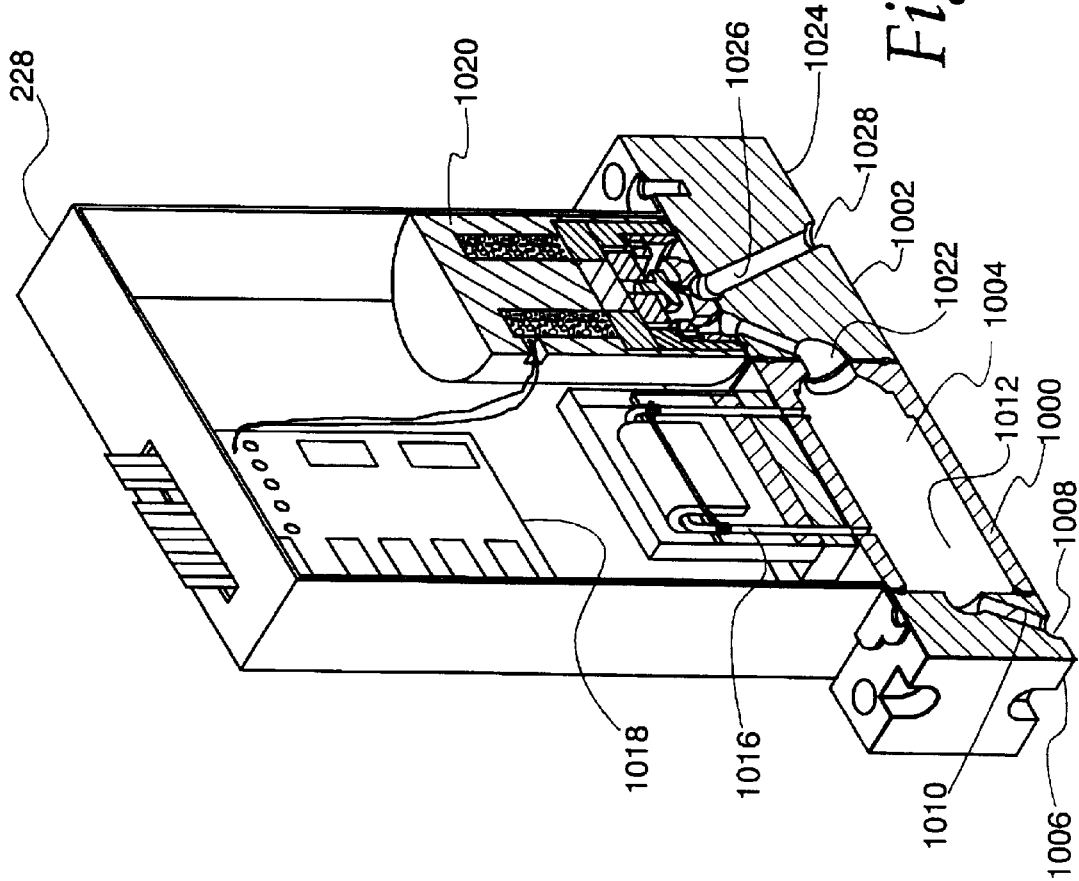
FIG. 8 is a perspective section view of a mass flow controller used with the gas panel embodying the present invention.

An exemplary mass flow controller 228, as may best be seen in FIG. 8, is used with the gas panel. The mass flow controller includes a pair of body blocks 1000 and 1002, bypass 1004 is mounted in a block 1000. Gas is received is in an inlet block 1006 through a gas aperture 1008 and is delivered through a bore 1010 to a bore 1012 within which the bypass is mounted. A portion of the gas flows through a sensor tube 1016 which provides an electrical signal to circuitry 1018 indicative of the rate of flow. A control signal is supplied to an electromagnetic valve 1020, which receives gas through an aperture 1022 of a block 1024, upon which the valve is mounted. Gas is then released through a bore 1026 to a bore aperture 1028 for delivery to other parts of the gas panel system.

Figure 9:
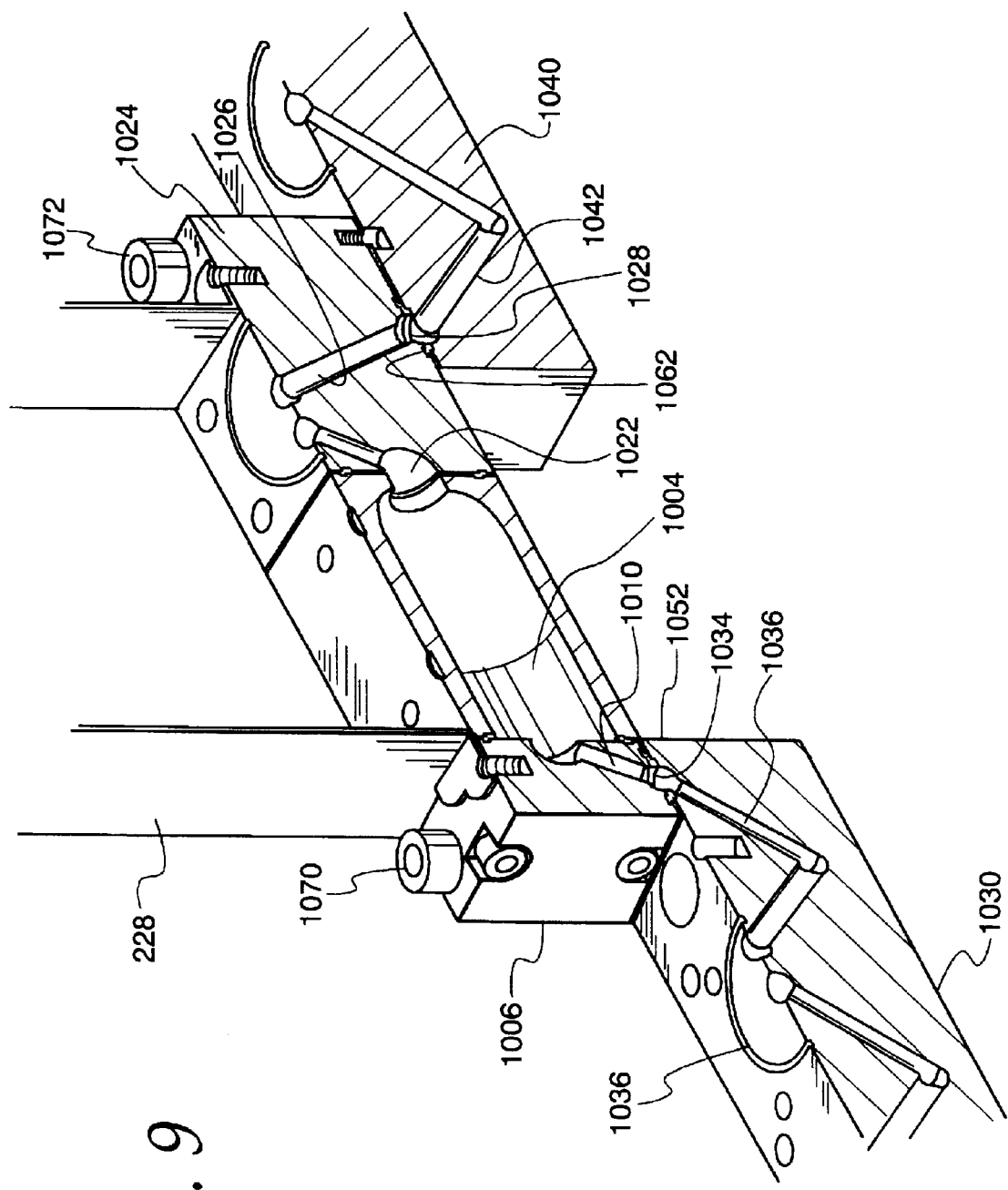
FIG. 9 is a view of a bottom portion of a mass flow control base block connected in jumpering configuration with portions of the gas panel system.

A simplified version of the mass flow controller 28 with some detail removed for clarity, as may best be seen in FIG. 9, discloses the manner in which the mass flow controller may be connected to a manifolding system having a first gas panel manifold 1030 with active site regions 1032 and 1034 thereon. A manifold bore 1036 is connected to the inlet block bore 1010. The outlet bore 1026 is connected to a manifold bore 1042 in a second one-piece gas panel manifold 1040.

A keeper 1050, as shown in FIGS. 10 and 11, having a seal ring 1052 mounted in a keeper aperture 1054, is positioned at the aperture 1034; which is the inlet to the mass flow controller. Likewise a keeper 1060, having a seal ring 1062, positioned in a bore 1064, is mounted on the manifold 1040, and couples the outlet aperture 1028 of the control block 1024 to the manifold 1040. The controller is mounted by a pair of bolts 1070 and 1072 to the manifolds 1030 and 1040.

It should be appreciated that the edge seal 1050 includes a plurality of semi-circular tabs 1080 extending thereabout for supporting the seal in the keeper prior to assembly.

Figure 14:
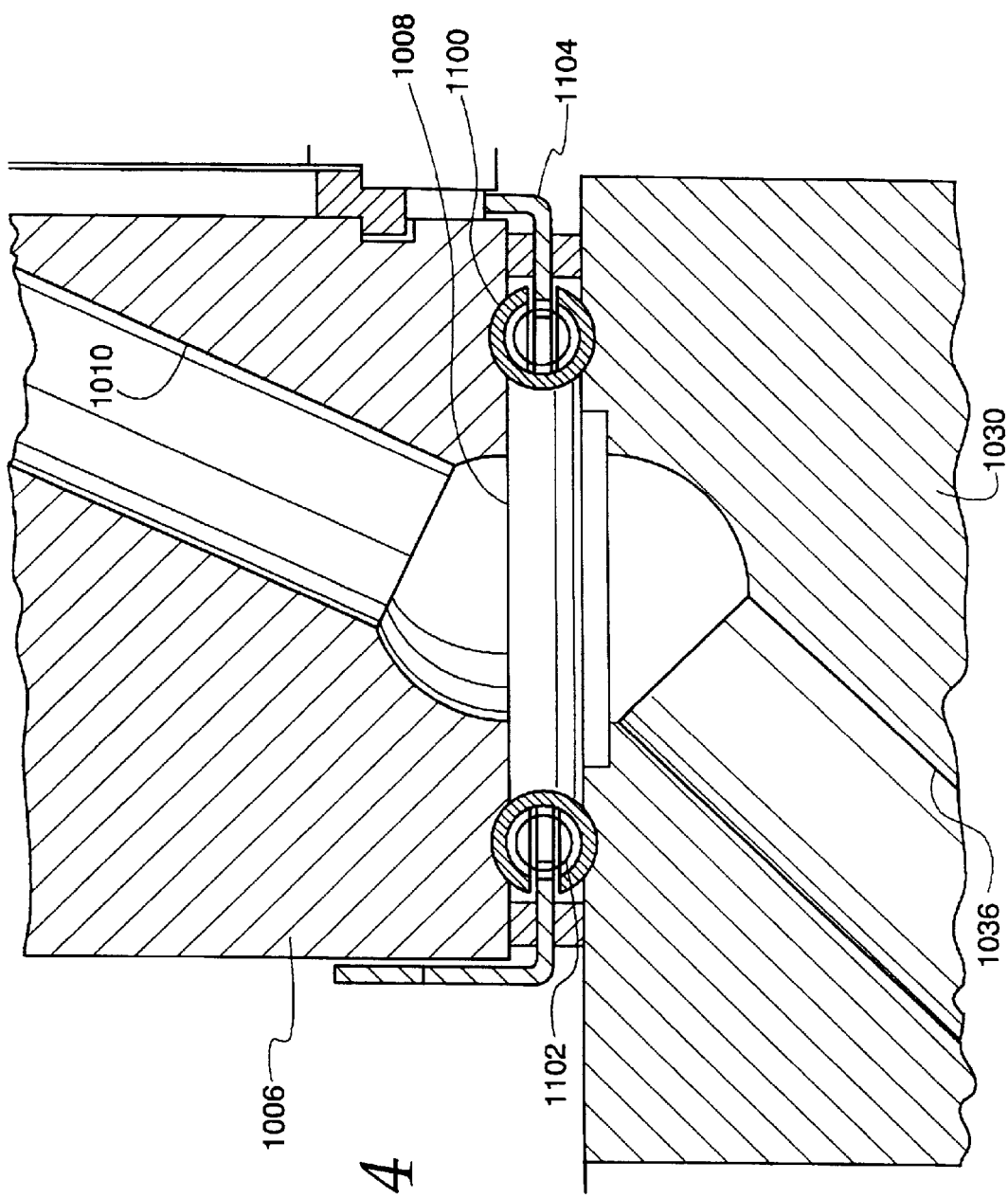
FIG. 14 is a sectional view taken between a portion of the mass flow controller and a portion of one of the gas panel manifold showing details of the engagement between the C-ring seal and the manifold.

In an alternative arrangement, as may best be seen in FIGS. 12–14, a C-ring type seal 1098 may be used between the inlet block 1010 of the mass flow controller and the manifold block 1030. The C-ring seal 1098 includes a substantially toroidal split ring 1100 having a helically wound spring 1102 positioned therein for supporting the split ring 1100. A keeper 1104 holds the split ring assembly 1098 in contact with itself. The keeper 1104 includes a first arcuate section 1116 having a split ring tab 1118 formed thereon for engagement with an open slot 1120 in the split ring. Likewise, the second wave-like arcuate section 1122 has a tab 1124 for engaging the split ring seal 1098. A shoulder section 1130, and the shoulder section 1132, also engage the opening 1120 to the split ring 1098. The keeper functions as the other keepers do in the system. It holds the split ring 1098 in registration with one of the apertures of the mass flow controller, when the mass flow controller is being attached to a manifold.

Figure 19:
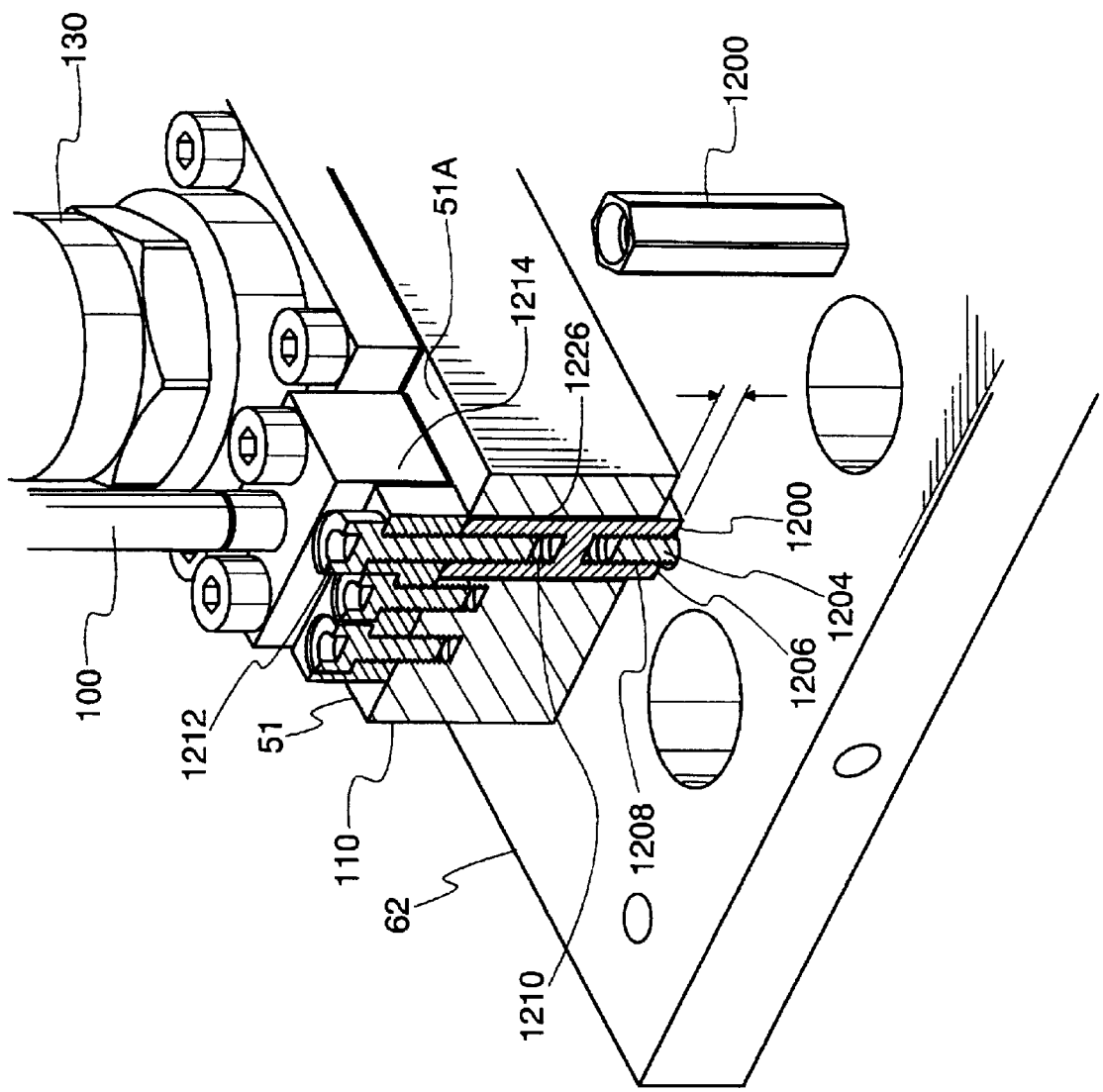
FIG. 19 is a perspective view, partially in section, showing details of the mounting of a gas manifold above the as panel support platform.

One of the advantages of the present invention is that the various gas manifolds may be mounted at selected heights above the aluminum platform. As may best be seen in FIG. 19, an inlet manifold 110 is mounted on a standoff 1200, which is identical to other standoffs 1200, extending through the platform 62. The standoff 1200 includes a bolt portion 1204 which is in threaded engagement with a sleeve 1206 at a bottom bore 1208. The sleeve 1206 includes an upper bore 1210 which receives a second or mounting bolt 1212 in threaded engagement therewith. The mounting bolt extending through a mounting bracket 1214.

It may be appreciated that the height at which the upper wall 51 of the inlet manifold 51 may be supported may be adjusted and may be aligned with other upper walls to provide a substantially planar, multiple wall surface for the attachment of bridging connections between successive gas sticks. In addition, a slight amount of play is allowed between a bore 1226 within which the sleeve is located and the sleeve itself, to allow for slight lateral transitions or movement of the manifolds with respect to one another to allow easy cross connections between the manifolds.

Figure 20:
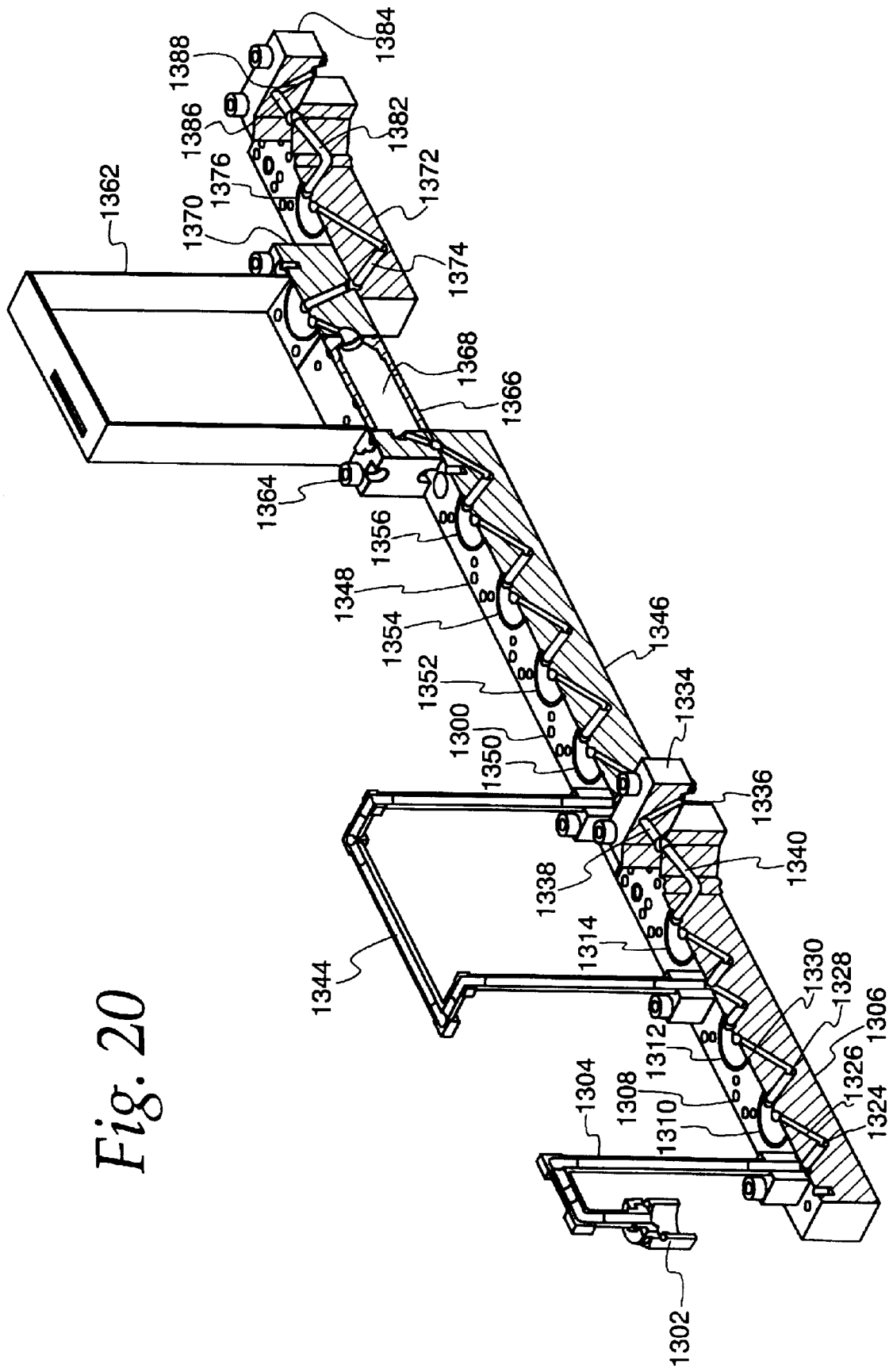
FIG. 20 is a perspective view of a partially disassembled gas panel stick to show details of some of the connection relations therein.

In another embodiment of the instant invention, a gas manifold assembly 1300, as may best be seen in FIG. 20, includes a VCR inlet 1302, which receives gas and sends gas through a jumper 1304 to a first gas manifold 1306, having a laterally extending upper wall 1308, having a plurality of active sites 1310, 1312 and 1314, positioned thereon.

For purposes of showing the geometry of the manifold, the active sites are unpopulated. But for instance, site 1310 would likely have a manual valve and sites 1312 and 1314 would likely have pneumatic valves connected to them. The position between the sites are inlet and outlet bores 1324 and 1326, pair of bores 1328 and 1330, extending between site 1310 and active site 1312 and the like. A cross connect 1334, which receives a gas, such as a-purged gas or nitrogen at a bore 1336, passes a gas to a second bore 1338, and then into a bore 1340, which is connected to the active site 1312, which is able to route gas to a second jumper 1344, coupled to a second gas manifold 1346.

The second gas manifold 1346 includes an upper wall 1348, having a plurality of active sites 1350, 1352, 1354 and 1356 coupled by pair of v-connected bores which are connected to a mass flow controller 1362 of which only the blocks and the housing are shown. The mass flow controller having an inlet block 1364 connected to receive gas, a first body block 1366 having a bypass 1368 therein, and a valve or outlet block 1370 connected to an outlet manifold 1372. The outlet manifold 1372 receives regulated gas from the mass flow controller at a bore 1374, and passes the gas to an active site 1376 which includes a valve or the like.

Another manifolding system 1400 is specifically adapted to be used in a moisture sampling system for determining the levels of trace amounts of moisture carried in a gas or other vapor stream. In operation, gas is flowed into the inlet 1408 and is received at a port 1420 and is delivered to a first valve station 1422, having a first pneumatic valve 1424 mounted thereon.

The gas may then be supplied to a moisture scrubber station through the valve 1424. The scrubber station 1426 has a scrubber connector 1428 connected thereto with a pair or tubing stubs 1430 and 1432 for connection to a moisture scrubber. Also connected to the inlet is a pneumatic valve 1442, connected at a pneumatic valve station 1444 to receive gas therefrom. The scrubber station 1426 is connected to a third valve station 1450 having a pneumatic valve 1452 connected thereto.

The pneumatic valve 1452, like pneumatic valve 1442, is connectable to send gas from the inlet to a mass flow controller 1460 mounted at a controller station 1462.

In normal operation, nominally completely dry gas is supplied to the mass flow controller by opening valve 1424 and valve 1452 while holding valve 1442 closed. This causes the inlet gas to be fed through the moisture scrubber where moisture is removed. The dry gas is then fed to the mass flow controller.

In the event that a measurement of the amount of moisture in the gas is to be made, the valves 1424 and 1452 are closed. Valve 1442 is opened, and the gas to be measured is flowed directly into the mass flow controller. Downstream of the mass flow controller is a permeation site 1468 having a permeation cell 1470 connected thereto for supplying a trace amount of moisture to the gas, after it flows out of the mass flow controller. The gas is then delivered to a first pneumatic valve 1486 and a second pneumatic valve 1488 at valve sites 1490 and 1492, respectively.

A trace moisture sensor 1496 is connected to receive gas from the valve 1486 and delivers the gas to a valve 1498. In addition, gas from the permeation cell 1470 may be delivered to the valve 1488 for later downstream delivery to other locations. An outlet 1500 is provided from valve 1498 and an outlet is provided from the valve 1488.

Zero mode operation, when the scrubber is connected in series with the mass flow controller, causes the valves 1486, 1488, and 1498 to be opened allowing some moisture carrying gas to enter the sensor cell 1496 and other moisture carrying gas to be exhausted out through the valve 1488.

In a span mode, which is necessary to determine a transfer function of the overall apparatus, valves 1486 and 1498 are open, causing all of the gas to flow through the sensor 1496 and out the valve V6 at a low flow rate. In a sample measuring mode valves 1486, 1488 and 1498 are all open.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

What is claimed is:

1. A gas panel comprising:

a plurality of gas inlets;

a one-piece gas panel manifold connected to each inlet of each of said plurality of gas inlets, each of said one-piece gas panel manifolds defining a substantially transverse gas path therethrough and having a plurality of active device stations positioned across a top face thereof, a plurality of removable active devices removably connected to each of the plurality of active device stations for receiving said gas, each of said removable active devices being connected by a single device connector to couple both to inlet and outlet ports of each of the plurality of active device stations, wherein at least one of the plurality of active devices is preassembled and comprises a base, a keeper mounted on the base, a seal held by the keeper, a fastener retained with the base and extending through the base, and a retainer; and a plurality of gas outlets connected to each of the one-piece manifolds.

2. The gas panel according to claim 1, wherein said plurality of removable active devices include: a shut off valve, a pressure regulator and a mass flow controller.

3. The gas panel according to claim 2, wherein said shut off valve further includes: a manual shut off valve.

4. The gas panel according to claim 1, wherein an interface region between each manifold and each of said plurality of active devices removably connected thereto is substantially planar and substantially parallel to the flow of gas from the inlet of each respective manifold to the outlet of each respective manifold.

5. A gas panel comprising:

a gas inlet;

a manifold body connected to the inlet, wherein the manifold body has an active device station; and a preassembled active device connected to the active device station, wherein the preassembled active device comprises a base, a keeper mounted on the base, a seal held by the keeper, a fastener retained with the base and extending through the base for connection to a manifold of a gas panel, and a retainer for holding the fastener to the base prior to assembly of the base with the manifold.

6. A preassembled active device for use in a gas panel comprising:

a base;

a keeper mounted on the base;

a seal held by the keeper;

a fastener retained with the base and extending through the base for connection to a manifold of a gas panel; and a retainer for holding the fastener to the base prior to assembly of the base with the manifold.

* * * * *